(12) United States Patent
Itasaka

(10) Patent No.: US 10,965,248 B2
(45) Date of Patent: Mar. 30, 2021

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Yosuke Itasaka, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/824,088

(22) Filed: Mar. 19, 2020

(65) Prior Publication Data
US 2020/0304066 A1 Sep. 24, 2020

(30) Foreign Application Priority Data
Mar. 22, 2019 (JP) .............................. JP2019-054049

(51) Int. Cl.
*H03B 5/06* (2006.01)
*H03B 5/20* (2006.01)
*H03B 5/36* (2006.01)

(52) U.S. Cl.
CPC ................. *H03B 5/06* (2013.01); *H03B 5/20* (2013.01); *H03B 5/362* (2013.01)

(58) Field of Classification Search
CPC ........................................................ H03B 5/06
USPC ..................................................... 331/107 R
See application file for complete search history.

(56) References Cited

U.S. PATENT DOCUMENTS

| 2008/0174377 A1* | 7/2008 | Makuta ................ H03B 5/362 331/116 R |
| 2018/0097474 A1* | 4/2018 | Aoki ....................... H03B 1/02 |
| 2019/0035848 A1* | 1/2019 | Tanaka ................. H01L 41/053 |

FOREIGN PATENT DOCUMENTS

JP          2018-098428 A        6/2018

* cited by examiner

*Primary Examiner* — Joseph Chang
(74) *Attorney, Agent, or Firm* — Workman Nydegger

(57) ABSTRACT

Provided is a circuit device including: a first terminal electrically coupled to one end of a vibrator; a second terminal electrically coupled to the other end of the vibrator; a first coupling wiring electrically coupled to the first terminal; a second coupling wiring electrically coupled to the second terminal; an oscillation circuit having a drive circuit for driving the vibrator via the first coupling wiring and the second coupling wiring, and oscillating the vibrator; and a first capacitor having a metal-insulator-metal (MIM) structure of which one electrode is electrically coupled to the first coupling wiring. The first coupling wiring and the first capacitor having the MIM structure overlap each other in plan view in a direction orthogonal to a substrate on which a circuit element is formed.

14 Claims, 15 Drawing Sheets

CIRCUIT DEVICE, OSCILLATOR, ELECTRONIC APPARATUS, AND VEHICLE

The present application is based on, and claims priority from JP Application Serial Number 2019-054049, filed Mar. 22, 2019, the disclosure of which is hereby incorporated by reference herein in its entirety.

BACKGROUND

1. Technical Field

The present disclosure relates to a circuit device, an oscillator, an electronic apparatus, and a vehicle.

2. Related Art

In the related art, a circuit device having an oscillation circuit that oscillates a vibrator such as a quartz crystal vibrator is known. JP-A-2018-98428 discloses such a layout disposition of a circuit device. JP-A-2018-98428 discloses a layout disposition method for a terminal to which a vibrator is coupled, a terminal to which power supply is supplied, and a power supply line.

It is desirable that a coupling wiring that couples the terminal, to which the vibrator is coupled, and the drive circuit of the oscillation circuit with each other, has a wiring width as wide as possible in order to prevent a signal attenuation due to a wiring resistance. On the other hand, the oscillation circuit requires a capacitor for adjusting a load capacitance or the like, and in order to obtain a larger capacity with a small disposition area, it is desirable to use a capacitor having a metal-insulator-metal (MIM) structure as the capacitor. In this case, how to efficiently dispose a layout of the capacitors having an MIM structure becomes an issue.

SUMMARY

An aspect of the present disclosure relates to a circuit device including: a first terminal electrically coupled to one end of a vibrator; a second terminal electrically coupled to the other end of the vibrator; a first coupling wiring electrically coupled to the first terminal; a second coupling wiring electrically coupled to the second terminal; an oscillation circuit having a drive circuit for driving the vibrator via the first coupling wiring and the second coupling wiring, and oscillating the vibrator by driving the drive circuit; and a first capacitor having an MIM structure of which one electrode is electrically coupled to the first coupling wiring, in which the first coupling wiring and the first capacitor having the MIM structure overlap each other in plan view in a direction orthogonal to a substrate on which a circuit element is formed.

DESCRIPTION OF EXEMPLARY EMBODIMENTS

Hereinafter, the present embodiment will be described. Note that the present embodiment to be described below does not unduly limit the contents of the disclosure described in the appended claims. In addition, all configurations to be described in the present embodiment are not limited to being essential constituent conditions.

1. Circuit Device

Figure 1:
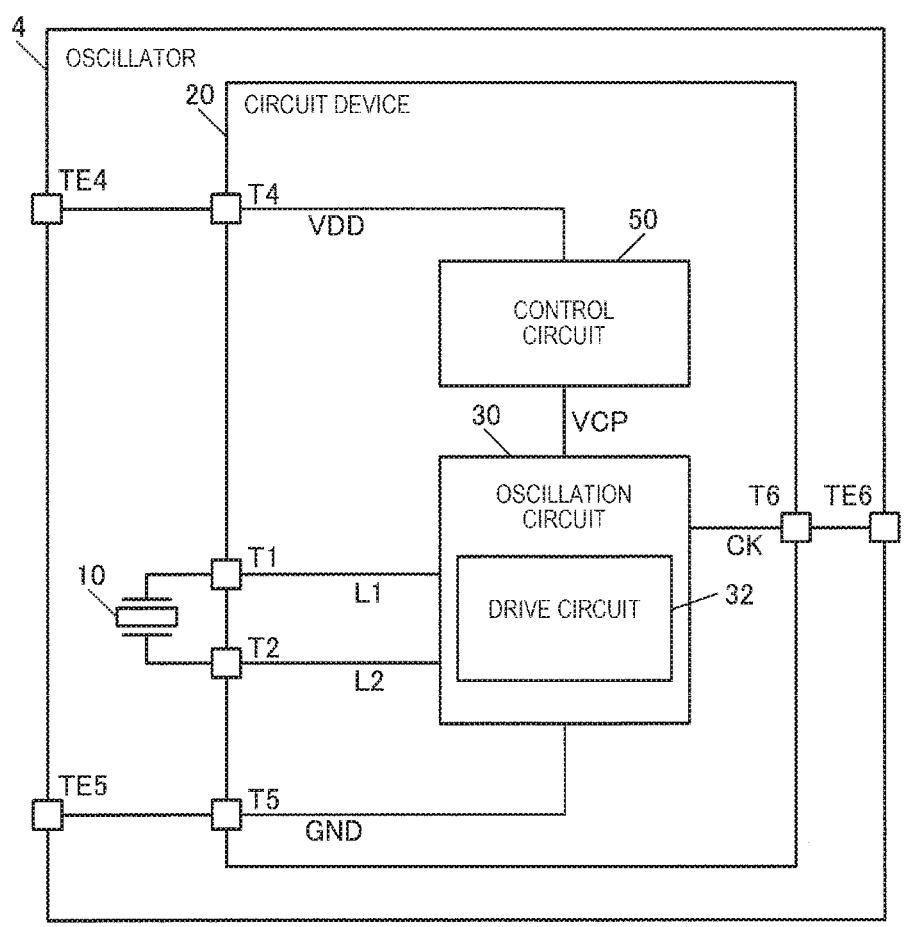
FIG. 1 shows a configuration example of a circuit device according to a present embodiment.

FIG. 1 shows a configuration example of a circuit device 20 according to a present embodiment. The circuit device 20 of the present embodiment includes terminals T1 and T2, coupling wirings L1 and L2, and an oscillation circuit 30. Further, as will be described later, a capacitor having a metal-insulator-metal (MIM) structure is included. Further, the oscillator 4 of the present embodiment includes a vibrator 10 and the circuit device 20. The vibrator 10 is electrically coupled to the circuit device 20. For example, the vibrator 10 and the circuit device 20 are electrically coupled using an internal wiring, a bonding wire, a metal bump, or the like of a package that accommodates the vibrator 10 and the circuit device 20.

The vibrator 10 is an element generating mechanical vibration by an electric signal. The vibrator 10 can be realized by a vibrator element such as a quartz crystal vibrator element, for example. For example, the vibrator 10 can be realized by a quartz crystal vibrator element in which a cut angle vibrates in a thickness-slide manner such as an AT cut or an SC cut. For example, the vibrator 10 may be a vibrator of a simple packaged crystal oscillator (SPXO). Alternatively, the vibrator 10 may be a vibrator built in a constant temperature oven controlled crystal oscillator (OCXO) having a constant temperature oven, or a vibrator built in a temperature compensated crystal oscillator (TCXO) having no constant temperature oven. Note that the vibrator 10 according to the present embodiment can be realized by various vibrator elements such as vibrator elements other than a thickness-slide vibration type or piezoelectric vibrator elements formed of materials other than quartz crystal. For example, as the vibrator 10, a surface acoustic wave (SAW) vibrator, a micro electro mechanical systems (MEMS) vibrator as a silicon vibrator formed using a silicon substrate, or the like may be adopted.

The circuit device 20 is an integrated circuit device called an integrated circuit (IC). For example, the circuit device 20 is an IC manufactured by a semiconductor process, and is a semiconductor chip in which circuit elements are formed on a semiconductor substrate.

The circuit device 20 includes the terminals T1 and T2, the coupling wirings L1 and L2, and the oscillation circuit 30. The circuit device 20 can include terminals T4 and T5 and a control circuit 50. The terminals T1, T2, T4, T5, and T6 are a first terminal, a second terminal, a fourth terminal, a fifth terminal, and a sixth terminal, respectively. Terminals T1, T2, T4, T5, and T6 are, for example, pads of the circuit device 20. The coupling wiring L1 is a first coupling wiring, and the coupling wiring L2 is a second coupling wiring.

The terminal T1 is electrically coupled to one end of the vibrator 10, and the terminal T2 is electrically coupled to the other end of the vibrator 10. For example, the terminals T1 and T2 of the circuit device 20 and the vibrator 10 are electrically coupled with each other using an internal wiring, a bonding wire, a metal bump, or the like of a package that accommodates the vibrator 10 and the circuit device 20. The terminal T4 is a terminal to which a power supply voltage VDD is input, and the terminal T5 is a terminal to which a ground voltage GND is input. The GND can also be referred to as VSS, and the ground voltage is, for example, a ground potential. The terminal T6 is a terminal from which a clock signal CK generated by the circuit device 20 is output. As shown in FIG. 1, the terminals T4, T5, and T6 are electrically coupled to external terminals TE4, TE5, and TE6 for external coupling of the oscillator 4, respectively. For example, the terminals T4 to T6 and the external terminals TE4 to TE6 are electrically coupled with each other using the internal wiring, the bonding wire, the metal bump, or the like of the package. The external terminals TE4 to TE6 of the oscillator 4 are electrically coupled to an external device.

The coupling wiring L1 is electrically coupled to the terminal T1. The coupling wiring L2 is electrically coupled to the terminal T2. The coupling wirings L1 and L2 are formed of a metal layer, for example. The drive circuit 32 of the oscillation circuit 30 is electrically coupled to the coupling wirings L1 and L2. Thereby, the drive circuit 32 is electrically coupled to the terminals T1 and T2 via the coupling wirings L1 and L2. In this case, the drive circuit 32 and the coupling wirings L1 and L2 may be directly coupled with each other, or may be coupled via a DC cut capacitor as will be described later.

The oscillation circuit 30 is a circuit that oscillates the vibrator 10. For example, the oscillation circuit 30 includes a drive circuit 32 that drives the vibrator 10 via the coupling wiring L1 and the coupling wiring L2, and oscillates the vibrator 10 by driving the drive circuit 32. That is the oscillation circuit 30 includes an oscillation drive circuit 32 provided between the terminal T1 and the terminal T2 that are vibrator coupling terminals. The drive circuit 32 is electrically coupled to the vibrator 10 via the terminals T1 and T2 and the coupling wirings L1 and L2, and oscillates the vibrator 10 by driving the vibrator 10 with current or voltage. The drive circuit 32 is a core circuit of the oscillation circuit 30 and can be realized by a transistor such as a bipolar transistor, a current source, or the like. Alternatively, the drive circuit 32 may be realized by an inverter circuit provided between the terminal T1 and the terminal T2. The oscillation circuit 30 is constituted by a drive circuit 32 and an active element such as a capacitor or a resistor. As the oscillation circuit 30, various types of oscillation circuits can be used such as a Pierce type, a Colpitts type, an inverter type, or a Hartley type. That is, as the drive circuit 32, a Pierce type, a Colpitts type, an inverter type or a Hartley type drive circuit can be used. The coupling in the present embodiment is an electrical coupling. The electrical coupling is a coupling to which an electrical signal is transmittable, and a coupling that enables transmission of information by an electrical signal. The electrical coupling may be a coupling via an active element or the like.

The control circuit 50 performs various control processing. For example, the control circuit 50 controls the entire circuit device 20. For example, an operation sequence of the circuit device 20 is controlled. The control circuit 50 performs various processing for controlling the oscillation circuit 30. For example, the control circuit 50 outputs a capacitance control voltage VCP for controlling the capacity of a variable capacitance circuit described later with respect to the oscillation circuit 30.

Here, the capacitance control voltage VCP is a voltage for a temperature compensation of the oscillation frequency of the oscillation circuit 30. For example, the control circuit 50 performs temperature compensation processing, generates a capacitance control voltage VCP based on the result of the temperature compensation processing, and outputs the capacitance control voltage VCP to the variable capacitance circuit of the oscillation circuit 30. Thereby, the temperature compensation using the variable capacitance circuit can be realized. Specifically, the control circuit 50 performs function generation processing for compensating the frequency-temperature characteristics of the vibrator 10 by using the polynomial approximation. For example, the control circuit 50 generates a zeroth-order component signal, a first-order component signal, a second-order component signal, a third-order component signal, and a high-order component signal for approximating a zeroth-order component, a first-order component, a second-order component, a third-order component, and a high-order component of the frequency-temperature characteristics of the vibrator 10 based on the coefficient information for the zeroth-order component, first-order component, second-order component, third-order component, and high-order component read from the nonvolatile memory (not shown). The control circuit 50 performs adding processing of these zeroth-order component signal, first-order component signal, second-order component signal, third-order component signal, and high-order component signal, so that the capacitance control voltage VCP for compensating the frequency-temperature characteristics of the vibrator 10 is generated. The capacity of the variable capacitance circuit of the oscillation circuit 30 is controlled based on the capacitance control voltage VCP, so that the temperature compensation processing of the frequency of the clock signal CK is realized. As a signal generated by the control circuit 50, for example, a second-order component signal or a fourth-order component signal may be omitted.

Note that the oscillator 4 may be an SPXO that does not perform the temperature compensation processing. In this case, the capacitance control voltage VCP is used for a capacitance control of the variable capacitance circuit for setting the oscillation frequency of the vibrator 10 to a nominal frequency. For example, the frequency of the clock signal CK is measured at the time of manufacture or shipment, and the capacity of the variable capacitance circuit is set based on the frequency measurement result. For example, a capacitance adjustment value obtained by the measurement is written in the non-volatile memory. During an actual operation of the oscillator 4, the control circuit 50 reads the capacitance control value from the non-volatile memory, and sets the capacitance control voltage VCP based on the read capacitance control value.

Figure 2:
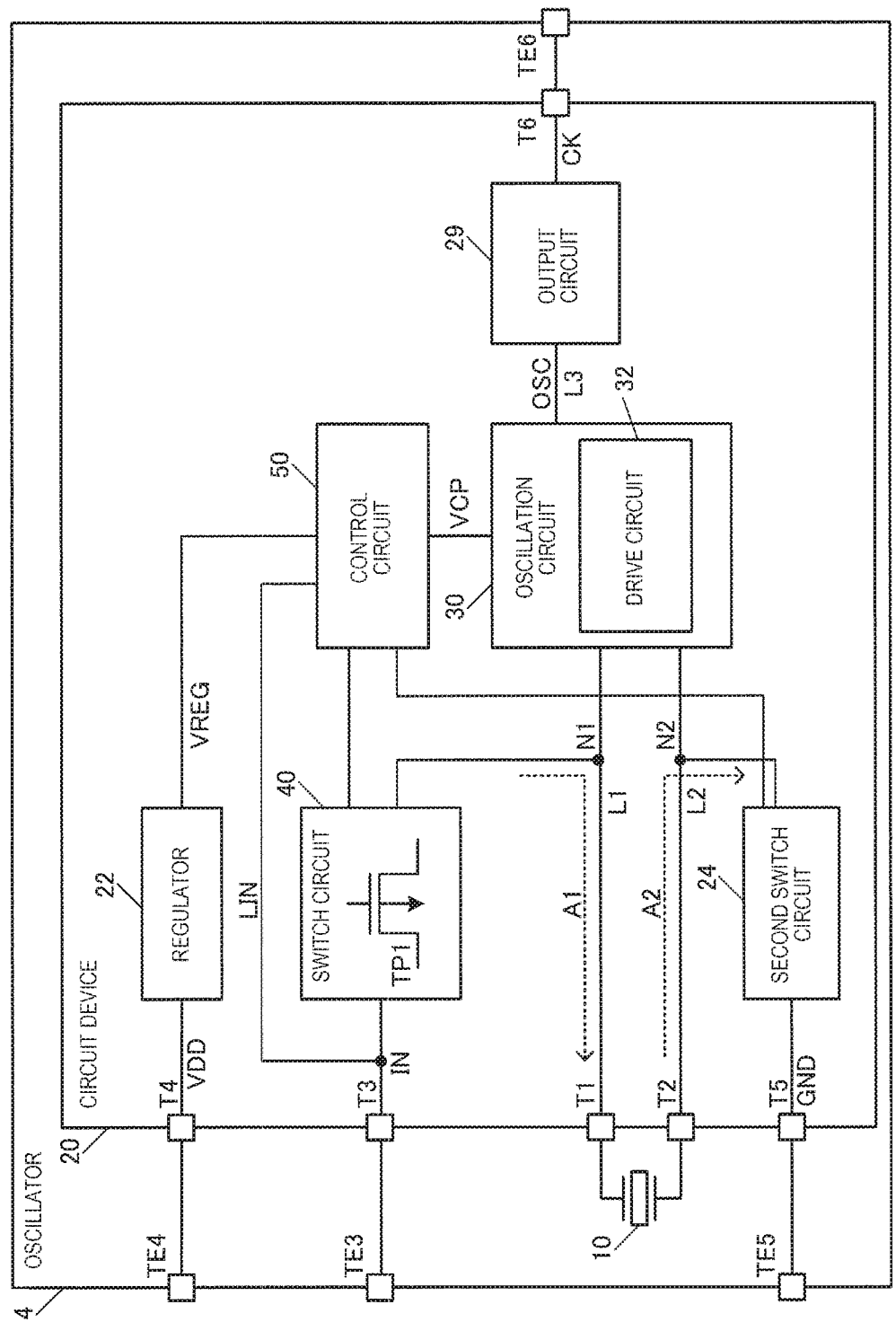
FIG. 2 shows a detailed configuration example of the circuit device according to the present embodiment.

FIG. 2 shows a detailed configuration example of the circuit device 20. In FIG. 2, in addition to the configuration in FIG. 1, a switch circuit 40, a second switch circuit 24, an output circuit 29, and a terminal T3 are further provided.

The regulator 22 performs a regulation operation based on the power supply voltage VDD from the terminal T4, and generates a regulated voltage VREG. The oscillation circuit 30 operates using, for example, a regulated voltage VREG as a power supply voltage.

The terminal T3 is a terminal to which an external input signal IN is input. The terminal T3 is a third terminal. The terminal T3 is, for example, a pad of the circuit device 20, and is electrically coupled to the external terminal TE3 of the oscillator 4. For example, the terminal T3 is a terminal to which the external input signal IN can be input, and the external input signal IN is input in a first mode or a second mode. The first mode is, for example, a normal operation mode, and the second mode is, for example, a test mode. The test mode can also be called an inspection mode.

The switch circuit 40 is provided between the coupling wiring L1 which couples the terminal T1 and the oscillation circuit 30, and the terminal T3. The switch circuit 40 has a P-type transistor TP1. For example, one end of the switch circuit 40 is coupled to the coupling wiring L1. For example, it is coupled to a node N1 which is a coupling node with the coupling wiring L1. The other end of the switch circuit 40 is coupled to the terminal T3. The switch circuit 40 is controlled to be turned on and off by the control circuit 50. For example, when the switch circuit 40 is turned on, the terminal T3 and the terminal T1 are electrically coupled with each other. Thereby, the external input signal IN can be input to the one end of the vibrator 10.

For example, in the normal operation mode, a frequency control signal, an output enable signal, or a standby signal is input as the external input signal IN via the terminal T3. At this time, the switch circuit 40 is already turned off. The external input signal IN that is a frequency control signal, an output enable signal, or a standby signal is input to the control circuit 50 via a signal input coupling wiring LIN. The control circuit 50 performs frequency control, output enable control, or standby control processing based on the frequency control signal, output enable signal, or standby signal input via the coupling wiring LIN.

On the other hand, in the test mode, a test mode signal such as an overdrive signal is input as the external input signal IN via the terminal T3. Further, the test mode signal is input to the one end of the vibrator 10 via the switch circuit 40 that is turned on. The test mode is a mode for performing various tests and inspections such as removing foreign matter from the vibrator 10 by overdrive and inspecting drive level dependence (DLD) characteristics. The DLD characteristic is a characteristic indicating a relationship between an excitation level and an oscillation frequency of the vibrator 10. During an actual operation in which the oscillator 4 operates as a product, the circuit device 20 is set to the first mode. When a test or inspection for overdrive or DLD is performed on the oscillator 4, the circuit device 20 is set to the second mode.

The control circuit 50 outputs the regulated voltage VREG as the substrate voltage of the P-type transistor TP1 of the switch circuit 40 in the normal operation mode. Accordingly, the fluctuation of the power supply voltage VDD is transmitted to the coupling wiring L2 via a junction capacitance of the transistor TP1 and the situation where the oscillation frequency fluctuates can be prevented. On the other hand, in the test mode, the control circuit 50 outputs the power supply voltage VDD as the substrate voltage of the transistor TP1.

The second switch circuit 24 is provided between the coupling wiring L2 which couples the terminal T2 and the oscillation circuit 30, and the terminal T5. For example, one end of the second switch circuit 24 is coupled to the coupling wiring L2. For example, it is coupled to a node N2 which is a coupling node with the coupling wiring L2. The other end of the second switch circuit 24 is coupled to the terminal T5. The second switch circuit 24 is turned on when the switch circuit 40 is turned on. For example, the second switch circuit 24 is controlled to be turned on and off by the control circuit 50 in the same manner as the switch circuit 40 that is the first switch circuit. Further, when the switch circuit 40 is turned on, the second switch circuit 24 is also turned on to electrically couple the terminal T2 and the terminal T5. Thereby, the other end of the vibrator 10 can be set to GND, and an overdrive test of the vibrator 10 or the like can be performed with the paths indicated by A1 and A2 in FIG. 2.

The output circuit 29 is electrically coupled to the oscillation circuit 30 via the coupling wiring L3. Further, the oscillation signal OSC from the oscillation circuit 30 is buffered to output the clock signal CK. In this case, the output circuit 29 can output the clock signal CK to the outside in various signal formats. For example, the output circuit 29 outputs the clock signal CK to the outside in a signal format such as a low voltage differential signaling (LVDS), a positive emitter coupled logic (PECL), an high speed current steering logic (HCSL), or a differential complementary MOS (CMOS). For example, the output circuit 29 may be a circuit that can output the clock signal CK in at least two signal formats of LVDS, PECL, HCSL, and differential CMOS. In this case, the output circuit 29 outputs the clock signal CK in the signal format set by the control circuit 50. The signal format of the clock signal CK output from the output circuit 29 is not limited to a differential signal format, and may be a non-differential signal format such as a single-ended CMOS or a clipped sine wave, for example.

2. Capacitor Having MIM Structure

Figure 3:
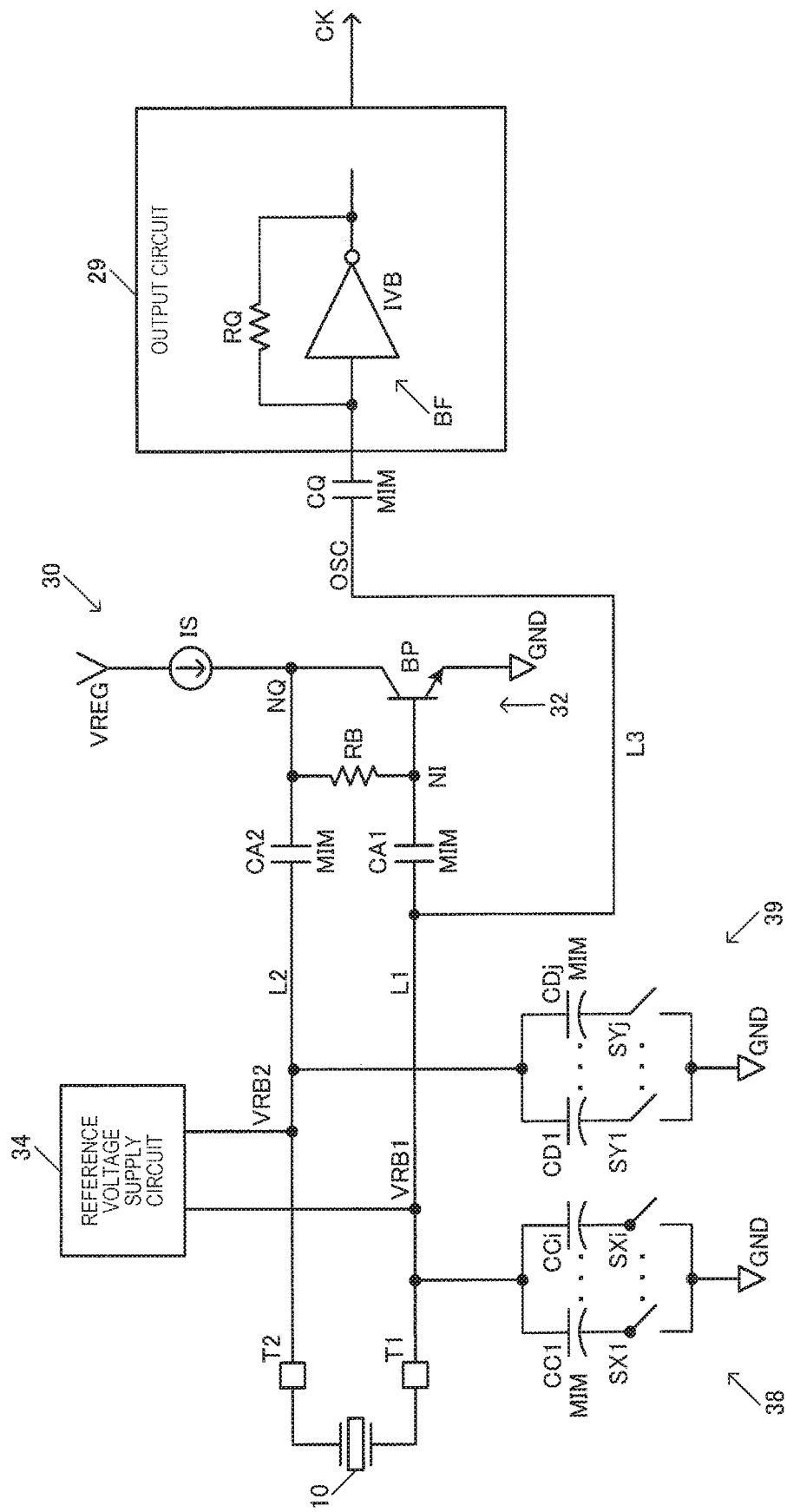
FIG. 3 shows a configuration example of an oscillation circuit and an output circuit.
Figure 4:
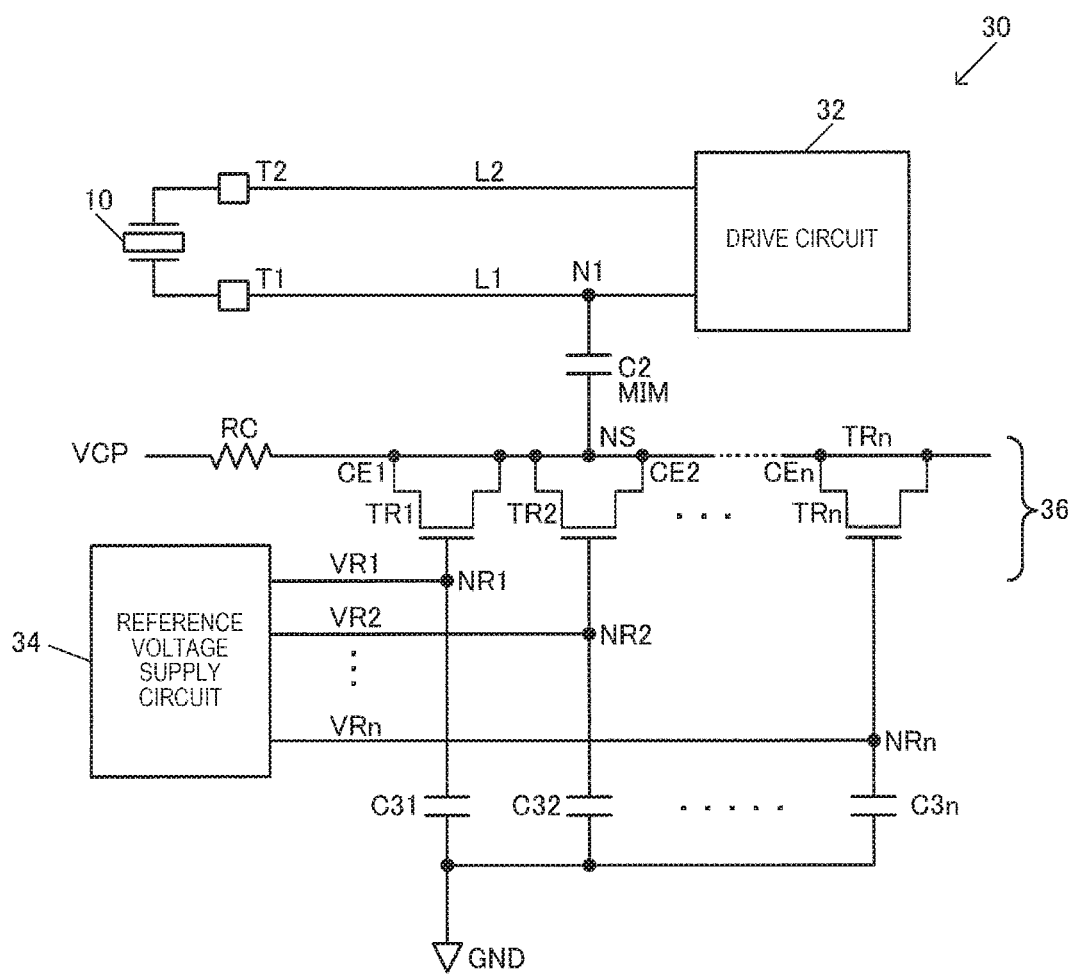
FIG. 4 shows a configuration example of the oscillation circuit provided with a variable capacitance circuit having a variable capacitance element.

In the present embodiment, a capacitor having an MIM structure is used in the oscillation circuit 30 or the like. FIG. 3 and FIG. 4 show configuration examples of the oscillation circuit 30 or the output circuit 29 in which such a capacitor having an MIM structure is used.

In FIG. 3, the drive circuit 32 includes a current source IS, a bipolar transistor BP, and a resistor RB. The current source IS is provided between the power supply node of VREG and the bipolar transistor BP, and supplies a constant current to the bipolar transistor BP. The bipolar transistor BP is a transistor that drives the vibrator 10. A base node is an input node NI of the drive circuit 32, and a collector node is an output node NQ of the drive circuit 32. The resistor RB is provided between the collector node and the base node of the bipolar transistor BP. The drive circuit 32 is electrically coupled to the coupling wirings L1 and L2 which are coupled to the terminals T1 and T2. Specifically, the drive circuit 32 is electrically coupled to the coupling wirings L1 and L2 via the DC cut capacitors CA1 and CA2.

The reference voltage supply circuit 34 generates a plurality of reference voltages including bias voltage setting reference voltages VRB1 and VRB2. Further, the reference voltage VRB1 is supplied to the coupling wiring L1, and the reference voltage VRB2 is supplied to the coupling wiring L2. A center amplitude voltage of the oscillation signal in the coupling wiring L1 is set by the reference voltage VRB1, and a center amplitude voltage of the oscillation signal in the coupling wiring L2 is set by the reference voltage VRB2. The reference voltage supply circuit 34 has, for example, a plurality of resistors provided in series between the power supply node and the GND node, and generates and outputs a divided voltage by the plurality of resistors as a plurality of reference voltages. In this case, the power supply node may be the regulated voltage VREG in FIG. 2.

The variable capacitance circuits 38 and 39 are circuits for adjusting the load capacitance of the oscillation circuit 30. The variable capacitance circuit 38 includes capacitors CC1 to CCi and switches SX1 to SXi provided between the coupling wiring L1 and the GND node. "i" is an integer of two or more. Ends of the capacitors CC1 to CCi are coupled to the coupling wiring L1, and the other ends of the capacitors CC1 to CCi are coupled to ends of the switches SX1 to SXi. The other ends of the switches SX1 to SXi are coupled to the GND node. The variable capacitance circuit 39 includes capacitors CD1 to CDj and switches SY1 to SYj provided between the coupling wiring L2 and the GND node. "j" is an integer of two or more. Ends of the capacitors CD1 to CDj are coupled to the coupling wiring L2, and the other ends of the capacitors CD1 to CDj are coupled to ends of the switches SY1 to SYj. The other ends of the switches SY1 to SYj are coupled to the GND node. The switches SX1 to SXi and SY1 to SYj are controlled to turn on or off by the control circuit 50 in FIGS. 1 and 2, so that the capacities of the variable capacitance circuits 38 and 39 are controlled, and the load capacitances in the coupling wirings L1 and L2 are adjusted. For example, an initial adjustment for setting the oscillation frequency of the vibrator 10 to the nominal frequency is realized by controlling the capacities of the variable capacitance circuits 38 and 39.

The output circuit 29 is electrically coupled to the oscillation circuit 30 via the coupling wiring L3. The coupling wiring L3 is a third coupling wiring. For example, the output circuit 29 is electrically coupled to the oscillation circuit 30 via the coupling wiring L3 and the capacitor CQ. Specifically, one end of the coupling wiring L3 is coupled to the coupling wiring L1 that couples the terminal T1 and the drive circuit 32 with each other, for example. That is, one end of the coupling wiring L3 is electrically coupled to the terminal T1 to which one end of the vibrator 10 is coupled. A DC cut capacitor CQ is provided between the other end of the coupling wiring L3 and an input node of the output circuit 29. The output circuit 29 buffers the oscillation signal OSC input from the oscillation circuit 30 and from which the DC component is cut, and outputs a clock signal CK. For example, the output circuit 29 includes a buffer circuit BF. Further, the buffer circuit BF performs a buffering operation of the oscillation signal OSC from the oscillation circuit 30, and performs, for example, a waveform shaping of the oscillation signal OSC. The buffer circuit BF includes, for example, an inverter IVB and a feedback resistor RQ provided between the output terminal and the input terminal of the inverter IVB.

As described above, in FIG. 3, the oscillation circuit 30 includes the variable capacitance circuits 38 and 39 that adjust the load capacitance of the oscillation circuit 30. In the present embodiment, the capacitors having the MIM structure are used as the capacitors CC1 to CCi and CD1 to CDj constituting the variable capacitance circuits 38 and 39. The capacitor having the MIM structure is, for example, a first capacitor. As described above, by using the capacitors having the MIM structure as the capacitors CC1 to CCi and CD1 to CDj constituting the variable capacitance circuits 38 and 39, the capacities of the variable capacitance circuits 38 and 39 can be changed in a wide variable range and the load capacitance can be appropriately adjusted.

In FIG. 3, a capacitor having an MIM structure is used as the DC cut capacitor CA1 provided between the coupling wiring L1 and the input node NI of the drive circuit 32. Further, a capacitor having an MIM structure is used as the DC cut capacitor CA2 provided between the coupling wiring L2 and the output node NQ of the drive circuit 32. Note that in FIG. 3, DC cut capacitors CA1 and CA2 are provided between the coupling wiring L1 and the input node NI, and provided between the coupling wiring L2 and the output node NQ, but only one of these may be provided with a DC cut capacitor. That is, it may be a structure that does not provide either one of the capacitor CA1 and CA2.

By providing DC cut capacitors CA1 and CA2 as shown in FIG. 3, the DC component of the oscillation signal in the coupling wirings L1 and L2 is cut, and the AC component of the oscillation signal is transmitted to the drive circuit 32. Thereby, the drive circuit 32 can appropriately perform an amplification operation of the oscillation signal. The reference voltage supply circuit 34 supplies the reference voltages VRB1 and VRB2 as the bias voltages of the coupling wirings L1 and L2, so that the amplitude center voltage of the oscillation signal in the coupling wirings L1 and L2 can be set to any voltage and an appropriate oscillation operation of the oscillation circuit 30 becomes possible.

In FIG. 3, a capacitor having an MIM structure is used as the DC cut capacitor CQ provided between the coupling wiring L3 from the oscillation circuit 30 and the output circuit 29. In this way, the DC component of the oscillation signal OSC of the oscillation circuit 30 can be cut using the capacitor CQ, and the AC component of the oscillation signal can be amplified and buffered by the buffer circuit BF of the output circuit 29 and an appropriate buffering operation of the oscillation signal OSC becomes possible.

In the oscillation circuit 30 in FIG. 4, the drive circuit 32, the reference voltage supply circuit 34, the variable capacitance circuit 36, the capacitor C2, and the capacitors C31 to C3n are provided. In FIG. 4, the variable capacitance circuit 36 is electrically coupled to the coupling wiring L1 that couples one end of the vibrator 10 and the oscillation circuit 30 with each other, via a DC cut capacitor C2.

For example, in FIG. 4, the variable capacitance circuit 36 includes n variable capacitance elements CE1 to CEn, and the variable capacitance elements CE1 to CEn are constituted by transistors TR1 to TRn. "n" is an integer of two or more. Reference voltages VR1 to VRn are supplied to gates of the transistors TR1 to TRn. These reference voltages VR1 to VRn are supplied by the reference voltage supply circuit 34. The capacitors C31 to C3n are provided between supply nodes NR1 to NRn of the reference voltages VR1 to VRn and the GND node. That is, the capacitors C31 to C3n are provided between the gate nodes of the transistors TR1 to TRn and the GND node. Further, sources and drains of respective transistors TR1 to TRn are short-circuited, and the capacitance control voltage VCP is supplied to the short-circuited sources and drains. For example, the control circuit 50 in FIGS. 1 and 2 supplies the capacitance control voltage VCP to the supply node NS of the capacitance control voltage VCP in the variable capacitance circuit 36 via the resistor RC. The supply node NS is coupled to the source and drain nodes of the transistors TR1 to TRn. The capacitor C2 is provided between the coupling wiring L1 and the supply node NS. That is, one end of the capacitor C2 is coupled to the node N1 which is a coupling node with the coupling wiring L1, and the other end of the capacitor C2 is coupled to the supply node NS of the capacitance control voltage VCP. The capacitor C2 is a DC cut capacitor, and the capacity of the capacitor C2 is sufficiently larger as compared with the capacity of the variable capacitance circuit 36.

Figure 5:
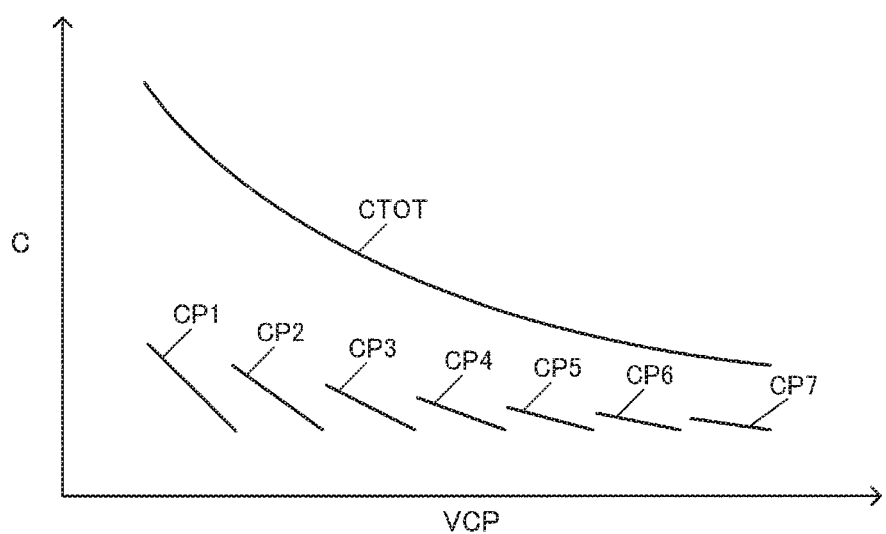
FIG. 5 shows an example of voltage capacitance characteristics of the variable capacitance circuit.

For example, in FIG. 4, it is assumed that n=7 and the variable capacitance circuit 36 is constituted by the variable capacitance elements CE1 to CE7. In this case, FIG. 5 shows the voltage capacitance characteristics of the capacities CP1 to CP7 of the variable capacitance elements CE1 to CE7 constituted by the transistors TR1 to TR7 and the voltage capacitance characteristics of the total capacity CTOT of the variable capacitance circuit 36. For example, when the sensitivity representing the frequency change with respect to the capacitance control voltage VCP is set to SVC, the slopes in the voltage capacitance characteristics of the capacities CP1 to CP7 in FIG. 5 corresponds to the sensitivity SVC. In FIGS. 4 and 5, when the capacitance control voltage VCP decreases and the load capacitance CL increases, for example, the sensitivity SVC for the variable capacitance element CE1 is increased to increase the slope of the voltage capacitance characteristic of the capacitance CP1. Specifically, the transistor size is increased by increasing the channel width or channel length of the transistor TR1 constituting the variable capacitance element CE1, and the sensitivity SVC is increased. Thereby, as shown in FIG. 5, the slope of the voltage capacitance characteristic of the capacity CP1 is increased, and the linearity of the total capacity CTOT is ensured. That is, in FIG. 5, the slope of the voltage capacitance characteristic of the capacity CP7 is the largest, and the slope of the voltage capacitance characteristic of the capacity CP1 is the smallest. By adjusting the slope of the voltage capacitance characteristics of the capacities CP7 to CP1 in this way, the linearity of the capacity CTOT of the variable capacitance circuit 36 is ensured. That is, the linearity of the capacitance change of the capacity CTOT can be ensured in the wide voltage range of the capacitance control voltage VCP.

As described above, in FIG. 4, the oscillation circuit 30 includes a variable capacitance circuit 36 that adjust the load capacitance of the oscillation circuit 30. The variable capacitance circuit 36 includes variable capacitance elements CE1 to CEn constituted by the transistors TR1 to TRn in which the capacitance control voltage VCP is supplied to the short-circuited sources and drains and the reference voltages VR1 to VRn are supplied to the gates. Further, a capacitor having an MIM structure is used as the DC cut capacitor C2 provided between the coupling wiring L1 and the variable capacitance circuit 36. By coupling the variable capacitance circuit 36 to the coupling wiring L1 via the DC cut capacitor C2, the load capacitance of the oscillation circuit 30 can be appropriately adjusted using the variable capacitance circuit 36. The coupling wiring L1 may be a wiring on an input node side or a wiring on an output node side of the drive circuit 32. Further, as the capacitors C31 to C3n in FIG. 4, capacitors having an MIM structure may be used.

3. Disposition of Capacitor Having MIM Structure

As described above, in the circuit device 20 of the present embodiment, a large number of MIM structure capacitors are used in the oscillation circuit 30 and the like. Therefore, how to efficiently dispose a layout of these capacitors having an MIM structure becomes an issue.

On the other hand, it is desirable that the coupling wirings L1 and L2 that couple the terminals T1 and T2, and the drive circuit 32 of the oscillation circuit 30 with each other, have wiring widths as wide as possible in order to prevent signal attenuation due to a wiring resistance. In this case, when the wiring widths of the coupling wirings L1 and L2 are made wider, without any contrivance about the layout disposition, the wiring area of the coupling wirings L1 and L2 becomes a dead space and a circuit area increases. Further, when the wiring widths of the coupling wirings L1 and L2 are wider, the parasitic capacitance of the coupling wirings L1 and L2 increases, and a problem such as a deterioration of the negative resistance or a reduction of the oscillation amplitude occurs.

Therefore, in the present embodiment, for example, the coupling wiring L1 and the capacitor having the MIM structure are overlapped each other in plan view in a direction orthogonal to the substrate on which the circuit element is formed. For example, a capacitor having an MIM structure of which one electrode is electrically coupled to the coupling wiring L1 is disposed so as to overlap the coupling wiring L1 in the plan view. Alternatively, a capacitor having an MIM structure of which one electrode is electrically coupled to the coupling wiring L2 is disposed so as to overlap the coupling wiring L2 in the plan view. Alternatively, a capacitor having an MIM structure of which one electrode is electrically coupled to the coupling wiring L3 is disposed so as to overlap the coupling wiring L3 in the plan view. The capacitor having the MIM structure is, for example, a first capacitor, a second capacitor, or a third capacitor. The substrate on which the circuit element is formed is a substrate of the circuit device 20, for example, a semiconductor substrate. On the substrate of the circuit device 20, an active element such as a transistor or a passive element such as a resistor or a capacitor is formed as a circuit element. The capacitor having the MIM structure is disposed so as to overlap the coupling wiring L1, L2, or L3 in the plan view in which a direction orthogonal to the substrate of the circuit device 20 is a viewing direction. For example, the capacitor having the MIM structure is disposed so as to at least partially overlap the coupling wiring L1, L2, or L3. For example, the capacitors are disposed so that at least half or more of the total area of the capacitors overlaps. For example, in the plan view, the capacitor having the MIM structure is disposed in a wiring path of the coupling wiring L1, L2, or L3. The wiring path is a path that becomes a wiring area of the coupling wiring L1, L2, or L3.

Figure 6:
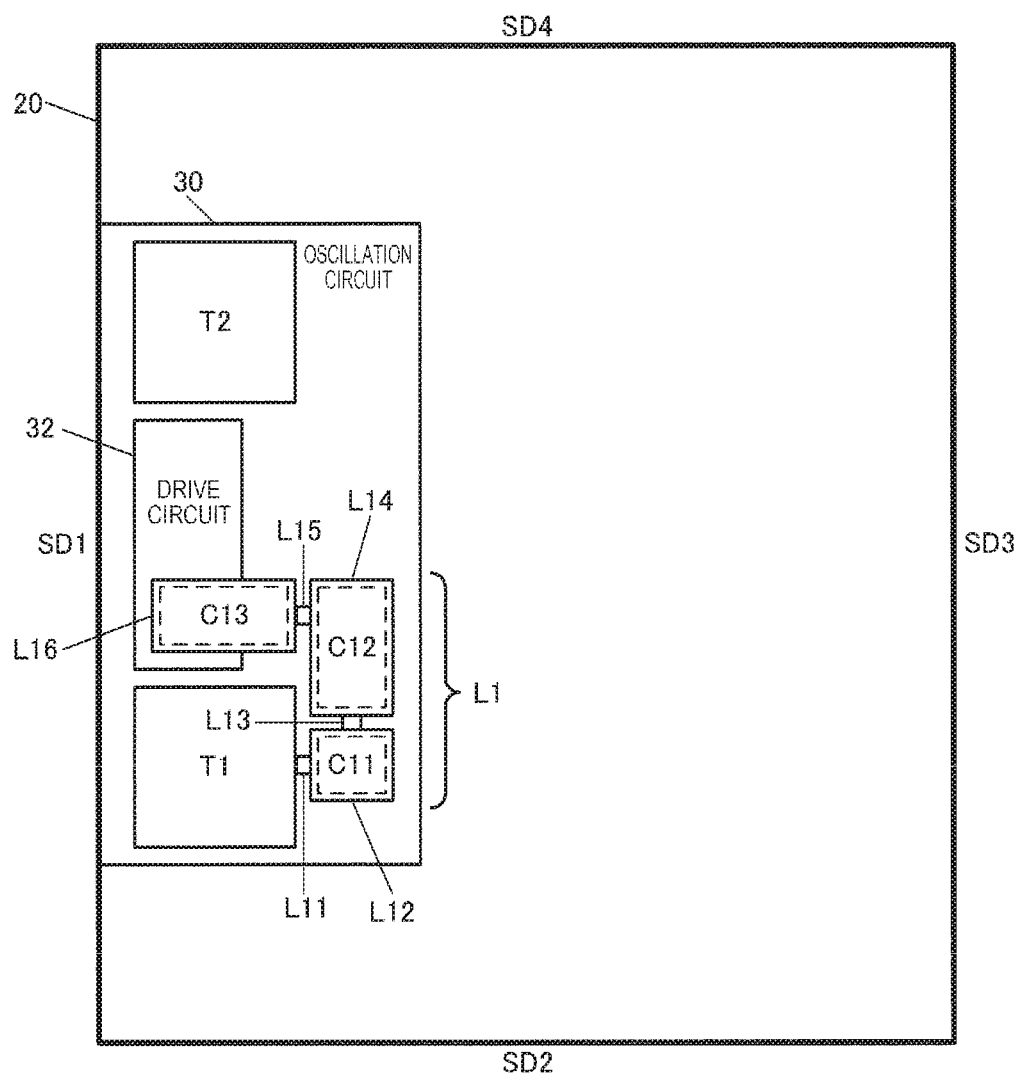
FIG. 6 shows a first layout disposition example of the circuit device.
Figure 6:
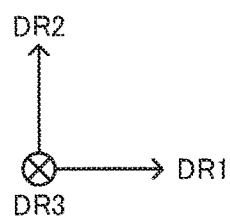

For example, FIG. 6 shows a first layout disposition example of the circuit device 20 of the present embodiment. In FIG. 6, a direction from a side SD1 of the circuit device 20 toward a side SD3 that is the opposite side of the side SD1 is defined as DR1. A direction from a side SD2 intersecting the side SD1 toward a side SD4 that is the opposite side of the side SD2 is defined as DR2. Here, the intersection is, for example, orthogonal. A direction orthogonal to the direction DR1 and the direction DR2 is defined as DR3. The side SD1, the side SD2, the side SD3, and the side SD4 are a first side, a second side, a third side, and a fourth side of the circuit device 20, respectively. The direction DR1, the direction DR2, and the direction DR3 are a first direction, a second direction, and a third direction, respectively. The direction orthogonal to the substrate of the circuit device 20 is the direction DR3. FIG. 6 is a plan view of the direction DR3 in plan view.

As shown in FIG. 6, the circuit device 20 includes the terminal T1 electrically coupled to one end of the vibrator 10, the terminal T2 electrically coupled to the other end of the vibrator 10, the coupling wiring L1 electrically coupled to the terminal T1, and the coupling wiring L2 electrically coupled to the terminal T2. Further, the circuit device 20 has the drive circuit 32 that drives the vibrator 10 via the coupling wiring L1 and the coupling wiring L2, and includes the oscillation circuit 30 that oscillates the vibrator 10 by driving the drive circuit 32. The circuit device 20 includes capacitors C11, C12, and C13 having the MIM structure of which one electrode is electrically coupled to the coupling wiring L1. The drive circuit 32 is disposed in a layout, for example, between the terminals T1 and T2. For example, the terminals T1 and T2 are disposed along the direction DR2. The drive circuit 32 is an area between the terminals T1 and T2, and is disposed in the direction DR2 when viewed from the terminal T1. In the plan view in the direction DR3 orthogonal to the substrate on which the circuit element is formed, the coupling wiring L1 and the capacitors C11, C12, and C13 having the MIM structure overlap each other. For example, in the wiring path of the coupling wiring L1 that electrically couples the terminal T1 and the drive circuit 32 with each other, the capacitors C11, C12, and C13 having the MIM structure are provided along the wiring path. In FIG. 6, the coupling wiring L1 is wired along the direction DR1 from the terminal T1, then wired along the direction DR2, thereafter, is wired in a square-bracket shape such that the coupling wiring L1 is wired along the direction opposite to the direction DR1.

One of the capacitors C11, C12, and C13 is the first capacitor. For example, electrodes that are ends of the capacitors C11, C12, and C13 are coupled to the coupling wiring L1. The other electrodes that are the other ends of the capacitors C11, C12, and C13 are coupled to, for example, a different circuit node. For example, the other electrodes are set to different voltages from each other. Alternatively, the capacitors C11, C12, and C13 may have capacitors in which the electrodes at the other ends are coupled to the same circuit node or set to the same voltage. As an example, one of the capacitors C11, C12, and C13 is one of the capacitors CA1, CC1 to CCi, and C2 in FIGS. 3 and 4. The other one of the capacitors C11, C12, and C13 is the other one of the capacitors CA1, CC1 to CCi, and C2 in FIGS. 3 and 4.

For example, in the wiring path of the coupling wiring L1 in FIG. 6, solid lines indicate the coupling wiring L1, and dotted lines indicate the capacitors C11, C12, and C13 having the MIM structure. As an example, capacitors C11, C12, and C13 are disposed below the coupling wiring L1. Alternatively, as will be described later, the capacitors C11, C12, and C13 may be positioned above the coupling wiring L1. For example, at least insulation layers of the capacitors C11, C12, and C13 are positioned above the coupling wiring L1. In this case, a part of a wiring of the coupling wiring L1 can be used as electrodes of the capacitors C11, C12, and C13. Here, the below is a direction from the circuit element of the circuit device 20 toward the substrate, and the above is an opposite direction thereof. The coupling wiring L1 is constituted by wirings L11, L12, L13, L14, L15, and L16 that are wiring portions of the coupling wiring L1. The wiring widths of the wirings L12, L14, and L16 are wider than the wiring widths of the wirings L11, L13, and L15. Further, a capacitor C11 is provided below or above the wiring L12 having a wide wiring width. Similarly, the capacitors C12 and C13 are respectively provided below or above the wirings L14 and L16 having large wiring widths. In this way, it is possible to dispose the capacitors C11, C12, and C13 having the MIM structure necessary for the oscillation circuit 30 and the like by effectively utilizing the wiring area of the coupling wiring L1. Note that when the capacitors C11, C12, and C13 are provided above the wirings L12, L14, and L16, for example, the wirings L12, L14, and L16 also serve as electrodes of the capacitors C11, C12, and C13. FIG. 6 shows a case where all the capacitors C11, C12, and C13 overlap the coupling wiring L1 in plan view but a part of each capacitor may not overlap the coupling wiring L1 in the plan view. For example, 50% or more of each capacitor may overlap the coupling wiring L1 in the plan view.

As described with reference to FIGS. 3 and 4, the capacitors C11, C12, and C13 having the MIM structure can be used as a DC cut capacitor CA1 of the drive circuit 32, the capacitors CC1 to CCi constituting the variable capacitance circuit 38, or a DC cut capacitor C2 of the variable capacitance circuit 36. In this way, the DC cut capacitor CA1 of the drive circuit 32, the capacitors CC1 to CCi constituting the variable capacitance circuit 38, or the DC cut capacitor C2 of the variable capacitance circuit 36 can be realized using the capacitors C11, C12, and C13 having the MIM structure disposed by effectively utilizing the wiring area of the coupling wiring L1, FIG. 6 schematically shows the case where three capacitors C11, C12, and C13 are provided in the wiring path of the coupling wiring L1, but the number of MIM structure capacitors provided in the wiring path is any number, and the circuit device 20 can be provided with the required number of MIM structure capacitors.

Figure 7:
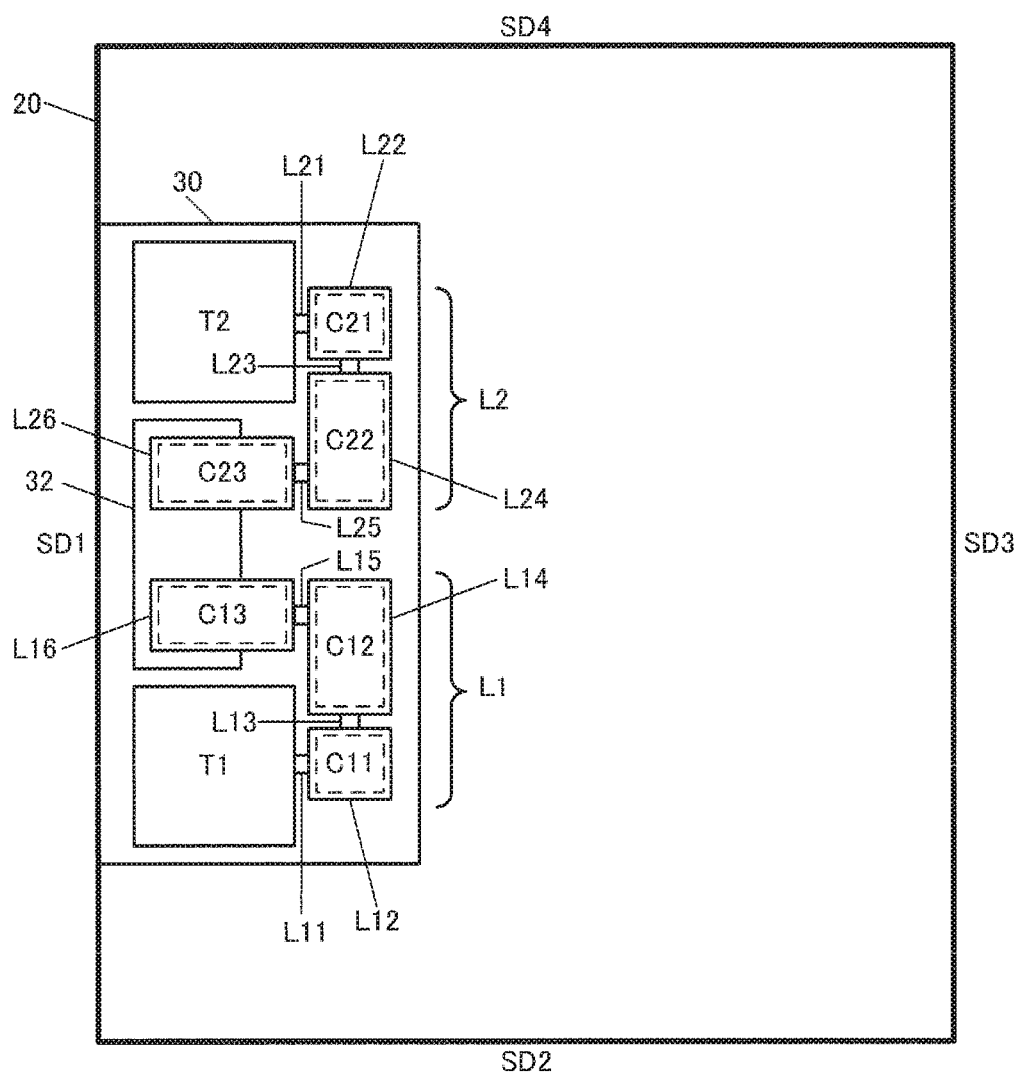
FIG. 7 shows a second layout disposition example of the circuit device.
Figure 7:
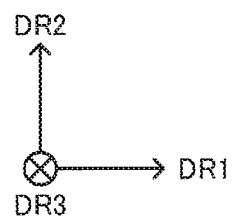

In FIG. 7, capacitors C21, C22, and C23 having the MIM structure are also provided in the path of the coupling wiring L2. That is, in the plan view in the direction DR3 orthogonal to the substrate, the coupling wiring L2 and the capacitors C21, C22, and C23 having the MIM structure overlap each other. For example, in the wiring path of the coupling wiring L2 that electrically couples the terminal T2 and the drive circuit 32 with each other, the capacitors C21, C22, and C23 having the MIM structure are provided along the wiring path. For example, the coupling wiring L2 is constituted by wirings L21, L22, L23, L24, L25, and L26 that are wiring portions of the coupling wiring L2. The wiring widths of the wirings L22, L24, and L26 are wider than the wiring widths of the wirings L21, L23, and L25. Further, the capacitors C21, C22 and C23 are respectively provided below or above the wirings L22, L24 and L26 having large wiring widths.

For example, electrodes that are ends of the capacitors C21, C22, and C23 are coupled to the coupling wiring L2. The other electrodes that are the other ends of the capacitors C21, C22, and C23 are coupled to, for example, a different circuit node. For example, the other electrodes are set to different voltages from each other. Alternatively, the capacitors C21, C22, and C23 may have capacitors in which the electrodes at the other ends are coupled to the same circuit node or set to the same voltage. As an example, one of the capacitors C21, C22, and C23 is one of the capacitors CA2 and CD1 to CDj in FIGS. 3 and 4. The other one of the capacitors C21, C22, and C23 is the other one of the capacitors CA2 and CD1 to CCj in FIGS. 3 and 4.

That is, the capacitors C21, C22, and C23 having the MIM structure are used as the DC cut capacitor CA2 of the drive circuit 32 and the capacitors CD1 to CDj constituting the variable capacitance circuit 38 as described with reference to FIGS. 3 and 4. In this way, the DC cut capacitor CA2 of the drive circuit 32 or the capacitors CD1 to CDj constituting the variable capacitance circuit 38 can be realized using the capacitors C21, C22, and C23 having the MIM structure disposed by effectively utilizing the wiring area of the coupling wiring L2. FIG. 7 schematically shows the case where three capacitors C21, C22, and C23 are provided in the wiring path of the coupling wiring L2, but the number of MIM structure capacitors provided in the wiring path is any number. Further, it is not always necessary to provide all of the above-described capacitors, and for example, the DC cut capacitors CA1 and CA2 may be omitted.

With the disposition as shown in FIG. 7, it is possible to dispose the capacitors C21, C22, and C23 having the MIM structure necessary for the oscillation circuit 30 and the like by effectively utilizing the wiring area of the coupling wiring L2. Note that when the capacitors C21, C22, and C23 are provided above the wirings L22, L24, and L26, for example, the wirings L22, L24, and L26 also serve as electrodes of the capacitors C21, C22, and C23. In FIG. 7, a part of the respective capacitors C21, C22, and C23 may not overlap the coupling wiring L2 in the plan view. For example, 50% or more of each capacitor may overlap the coupling wiring L2 in the plan view.

Figure 8:
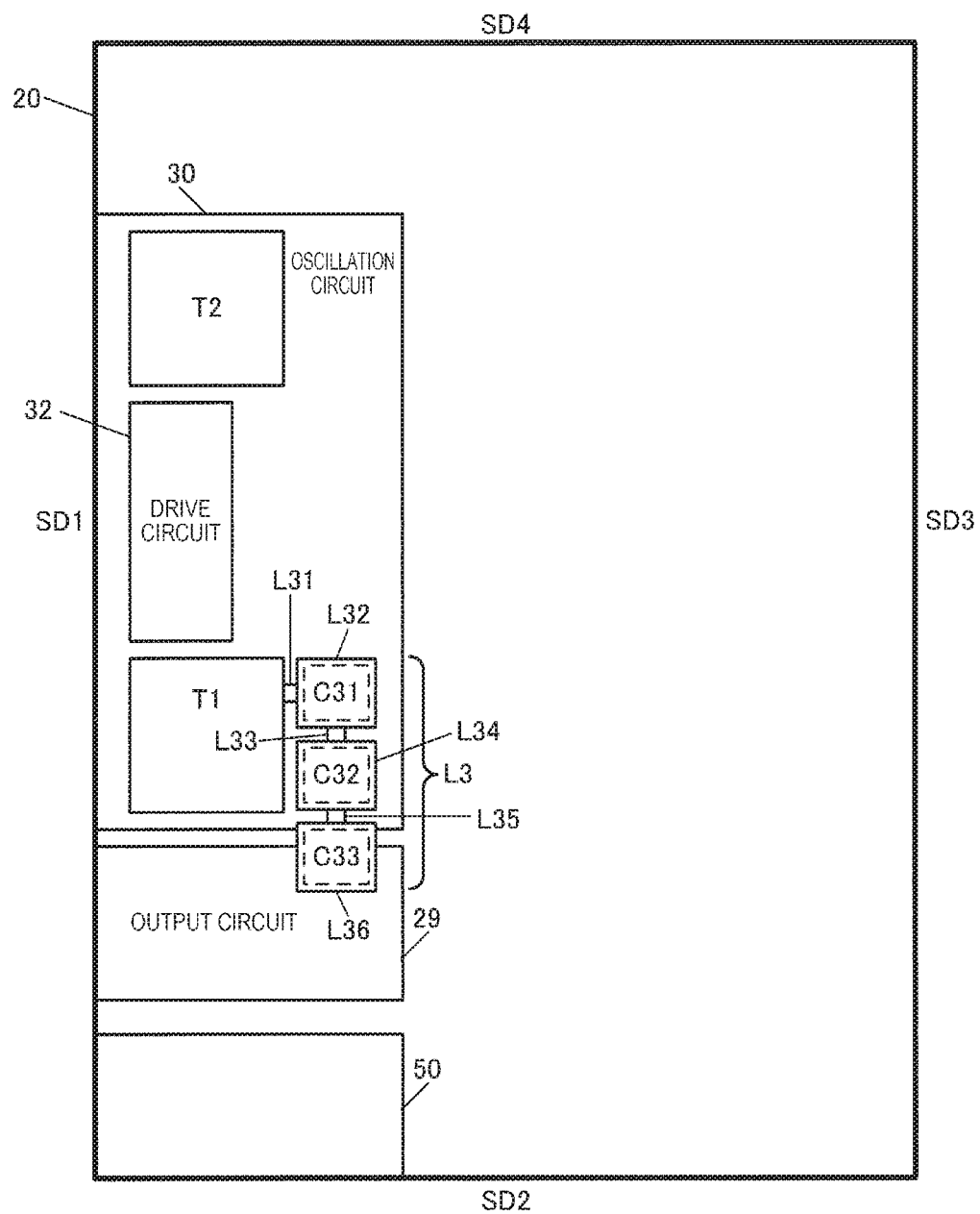
FIG. 8 shows a third layout disposition example of the circuit device.

In FIG. 8, the circuit device 20 includes an output circuit 29 that is electrically coupled to the oscillation circuit 30 via the coupling wiring L3. The output circuit 29 buffers the oscillation signal OSC from the oscillation circuit 30, for example, and outputs the clock signal CK. For example, in FIG. 3, the coupling wiring L3 is electrically coupled to the terminal T1, to which the vibrator 10 is coupled, via the coupling wiring L1. As shown in FIG. 8, in the plan view in the direction DR3, the coupling wiring L3 and the capacitors C31, C32, and C33 having the MIM structure overlap each other. For example, in the wiring path of the coupling wiring L3, the capacitors C31, C32, and C33 having the MIM structure are provided along the wiring path. When the coupling wiring L3 is coupled to the coupling wiring L1 as shown in FIG. 3, a part of the wiring path of the coupling wiring L3 may be the wiring path of the coupling wiring L1.

Here, one of the capacitors C31, C32, and C33 is a third capacitor. For example, electrodes that are ends of the capacitors C31, C32, and C33 are coupled to the coupling wiring L3. The other electrodes that are the other ends of the capacitors C31, C32, and C33 are coupled to, for example, a different circuit node. For example, the other electrodes are set to different voltages from each other. Alternatively, the capacitors C31, C32, and C33 may have capacitors in which the electrodes at the other ends are coupled to the same circuit node or set to the same voltage. As an example, one of the capacitors C31, C32, and C33 is the capacitor CQ in FIG. 3. Alternatively, two or more of the capacitors C31, C32, and C33 may be the capacitor CQ. The other one of the capacitors C31, C32, and C33 may be the capacitors CA1, CC1 to CCi, and C2 shown in FIGS. 3 and 4.

For example, the coupling wiring L3 is constituted by wirings L31, L32, L33, L34, L35, and L36. The wiring widths of the wirings L32, L34, and L36 are wider than the wiring widths of the wirings L31, L33, and L35. Further, the capacitors C31, C32 and C33 are respectively provided below or above the wirings L32, L34 and L36 having large wiring widths. At least one of the capacitors C31, C32, and C33 having the MIM structure provided in the path of the coupling wiring L3 is used as, for example, the DC cut capacitor CQ provided before the output circuit 29 in FIG. 3.

In this way, it is possible to dispose the capacitors C31, C32, and C33 having the MIM structure by effectively utilizing the wiring area of the coupling wiring L3. Further, the DC cut capacitor CQ of the output circuit 29 can be realized by using the capacitors C31, C32, and C33 having the MIM structure disposed by effectively utilizing the wiring area of the coupling wiring L3. Note that when the capacitors C31, C32, and C33 are provided below the wiring L32, L34, and L36, for example, the wiring L32, L34, and L36 also serve as electrodes of the capacitors C31, C32, and C33. In FIG. 8, a part of the respective capacitors C31, C32, and C33 may not overlap the coupling wiring L3 in the plan view. For example, 50% or more of each capacitor may overlap the coupling wiring L3 in the plan view.

Figure 9:
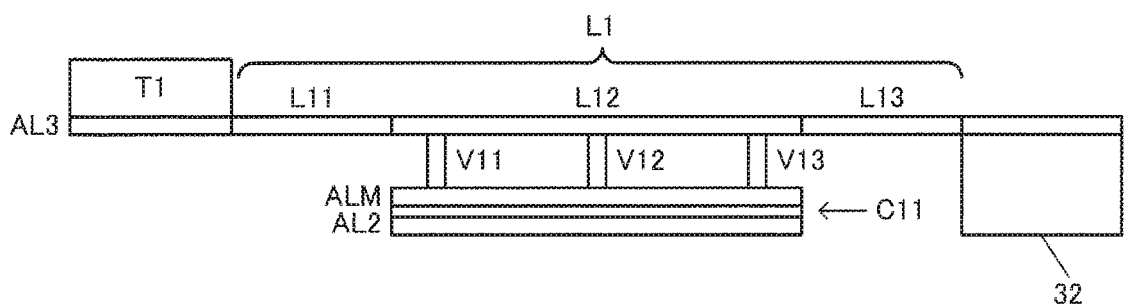
FIG. 9 is a diagram showing an example of a cross-sectional structure of an MIM capacitor.
Figure 10:
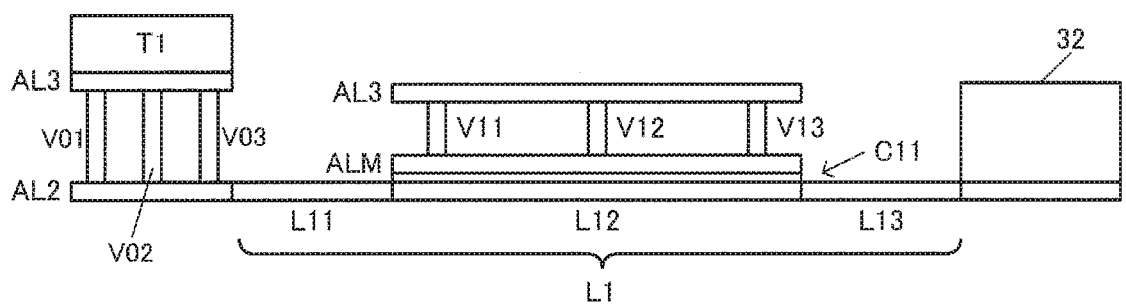
FIG. 10 is a diagram showing an example of a cross-sectional structure of the MIM capacitor.
Figure 11:
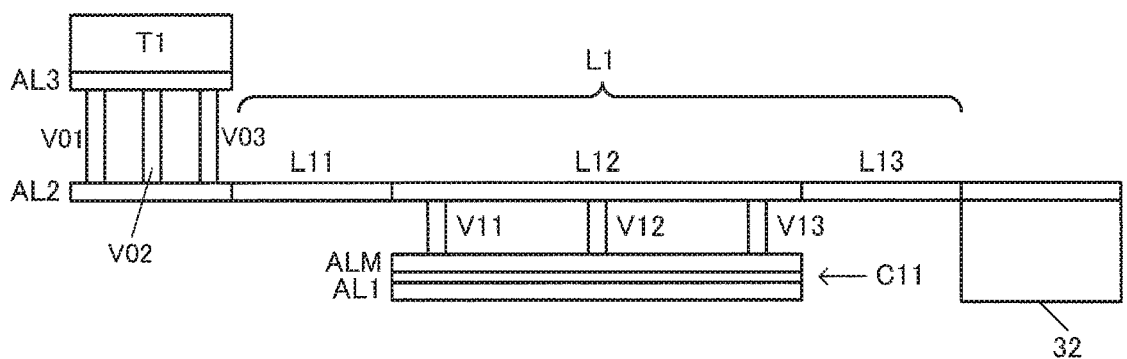
FIG. 11 is a diagram showing an example of a cross-sectional structure of the MIM capacitor.

Next, an example of a cross-sectional structure of the MIM capacitor will be described. FIG. 9, FIG. 10 and FIG. 11 show cross-sectional structural examples of the capacitor C11 having the MIM structure in the coupling wiring L1. In FIG. 9, FIG. 10, and FIG. 11, the coupling wiring L1 is constituted by a metal layer above AL3 or a metal layer below AL2 an MIM metal layer ALM constituting the capacitor C11. In the following description, a cross-sectional structure of the capacitor that overlaps the coupling wiring L1 in the plan view will be mainly described as an example, but a cross-sectional structure similar to the cross-sectional structure described below can also be adopted for the capacitor overlapping the coupling wiring L2 or the coupling wiring L3 in the plan view.

Specifically, in FIG. 9, the capacitor C11 having the MIM structure is constituted by an MIM metal layer ALM, a metal layer AL2, and an insulation layer provided between these metal layers. The MIM metal layer ALM becomes one electrode of the capacitor C11, and the metal layer AL2 becomes the other electrode of the capacitor C11. The capacitor C11 having the MIM structure is configured by providing the insulation layer between the one electrode and the other electrode.

Further, the coupling wiring L1 is constituted by the metal layer AL3. The terminal T1 and the drive circuit 32 are electrically coupled with each other through the coupling wiring L1. The coupling wiring L1 constituted by the metal layer AL3 and the MIM metal layer ALM are electrically coupled with each other via via-plugs V11, V12, and V13. The MIM metal layer ALM is a metal layer formed between two metal layers AL2 and AL3 in order to configure an electrode of a capacitor having the MIM structure. The metal layer AL3 is a metal layer above the metal layer AL2. These metal layers AL2 and AL3 or the MIM metal layer ALM are formed of, for example, aluminum or an aluminum alloy.

As described above, in FIG. 9, the coupling wiring L1 is constituted by the metal layer above AL3 the MIM metal layer ALM constituting the capacitor C11. The coupling wiring L1 and the MIM metal layer ALM serving as one electrode of the capacitor C11 are electrically coupled via, for example, the via-plugs V11, V12, and V13. Thereby, the one electrode of the capacitor C11 having the MIM structure can be electrically coupled to the coupling wiring L1. For example, in FIGS. 3 and 4, the DC cut capacitors CA1, CQ, and C2 in which electrodes are coupled to the coupling wiring L1, or the capacitors CC1 to CCi of the variable capacitance circuit 38 in which electrodes are coupled to the coupling wiring L1 can be realized by capacitors having the MIM structure.

Further, in FIG. 10, the capacitor C11 having the MIM structure is constituted by an MIM metal layer ALM, a metal layer AL2, and an insulation layer provided between these metal layers. The MIM metal layer ALM is electrically coupled to the metal layer above AL3 the MIM metal layer via the via-plugs V11, V12, and V13. Further, the coupling wiring L1 is constituted by the metal layer AL2. The terminal T1 is electrically coupled to the coupling wiring L1 constituted by the metal layer AL2 via via-plugs V01, V02, and V03. Thereby, the terminal T1 and the drive circuit 32 are electrically coupled with each other via the coupling wiring L1.

As described above, in FIG. 10, the coupling wiring L1 is constituted by the metal layer below AL2 the MIM metal layer ALM constituting the capacitor C11. In the coupling wiring L1, the wiring L12 at the position of the capacitor C11 becomes one electrode of the capacitor C11. That is, the wiring L12 of the coupling wiring L1 is also used as one electrode of the capacitor C1. Further, the MIM metal layer ALM becomes the other electrode of the capacitor C11. The capacitor C11 having the MIM structure is configured by providing the insulation layer between the one electrode and the other electrode. That is, the coupling wiring L1 is constituted by the wirings L11, L12, and L13. As described in FIG. 6 and the like, the wiring width of the wiring L12 is wider than the wiring widths of the wirings L11 and L13. In the coupling wiring L1, the wiring L12 having a wide wiring width is also used as one electrode of the capacitor C11 having the MIM structure. That is, in the coupling wirings L1, the wiring L12 that is the wiring portion at the position of the capacitor C11 is used as one electrode of the capacitor C11. Thereby, the one electrode of the capacitor C11 having the MIM structure can be electrically coupled to the coupling wiring L1. In FIGS. 3 and 4, the DC cut capacitors CA1, CQ, and C2 in which electrodes are coupled to the coupling wiring L1, or the capacitors CC1 to CCi in which electrodes are coupled to the coupling wiring L1 can be realized by capacitors having the MIM structure.

In FIG. 11, the coupling wiring L1 is constituted by the metal layer below AL2 the MIM metal layer. That is, in FIG. 9, the coupling wiring L1 is constituted by the metal layer above AL3 the MIM metal layer. In contrast to this, in FIG. 11, the terminal T1 is electrically coupled to the coupling wiring L1 constituted by the metal layer AL2 via the via-plugs V01, V02, and V03. The capacitor C11 having the MIM structure constituted by the MIM metal layer ALM and the metal layer AL1 is disposed below the coupling wiring L1 constituted by the metal layer AL2. The metal layer AL1 is a metal layer below the metal layer AL2, and the MIM metal layer ALM is a metal layer formed between the metal layer AL2 and the metal layer AL1.

Figure 12:
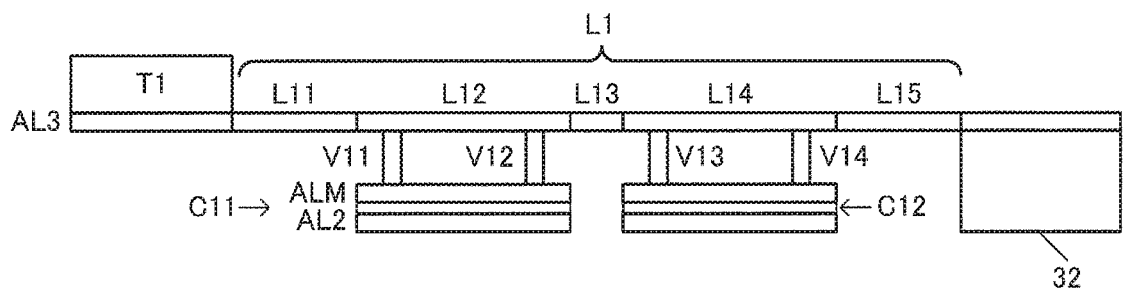
FIG. 12 is a diagram showing an example of a cross-sectional structure of the MIM capacitor.

FIG. 12 shows an example in which a plurality of capacitors C11 and C12 having the MIM structure are provided in the wiring path of the coupling wiring L1 that electrically couples the terminal T1 and the drive circuit 32 with each other. The coupling wiring L1 is constituted by the metal layer above AL3 the MIM metal layer.

The capacitor C11 having the MIM structure is provided below the wiring L12 of the coupling wiring L1, and constituted by the MIM metal layer ALM, the metal layer AL2, and the insulation layer provided between these metal layers. The MIM metal layer ALM becomes one electrode of the capacitor C11, and the metal layer AL2 becomes the other electrode of the capacitor C11. The metal layer AL2 is a metal layer below the metal layer AL3 constituting the coupling wiring L1. The coupling wiring L1 and the MIM metal layer ALM that is one electrode of the capacitor C11 are electrically coupled with each other via the via-plugs V11 and V12.

Further, the capacitor C12 having the MIM structure is provided below the wiring L14 of the coupling wiring L1, and constituted by the MIM metal layer ALM, the metal layer AL2, and the insulation layer provided between these metal layers. The MIM metal layer ALM becomes one electrode of the capacitor C12, and the metal layer AL2 becomes the other electrode of the capacitor C12. The coupling wiring L1 and the MIM metal layer ALM that is one electrode of the capacitor C12 are electrically coupled via the via-plugs V13 and V14. In this way, the capacitors C11 and C12 are provided below the wirings L12 and L14, respectively, and as described with reference to FIG. 7, the wirings L12 and L14 have wiring widths wider than wiring widths of the other wirings L11, L13, and L15 constituting the coupling wiring L1.

Figure 13:
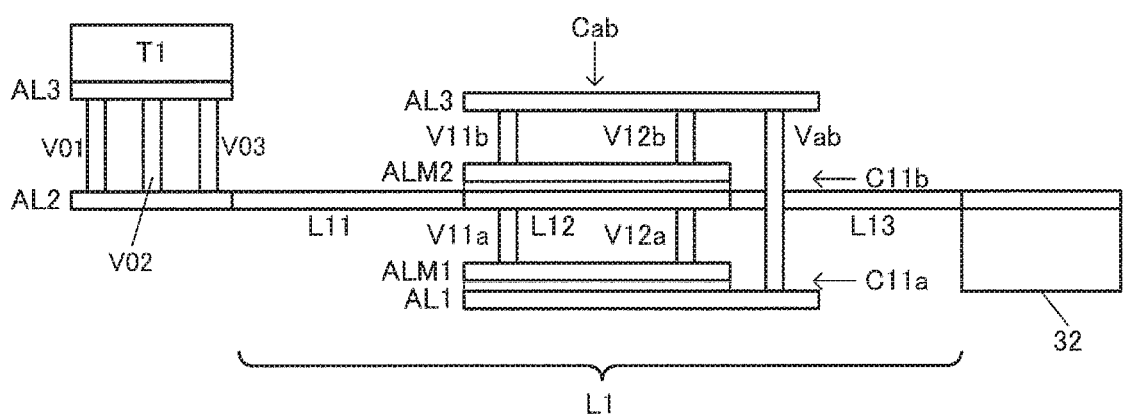
FIG. 13 is a diagram showing an example of a cross-sectional structure of the MIM capacitor.

FIG. 13 shows an example of a capacitor Cab having an MIM stack structure. The capacitor Cab having the MIM stack structure in FIG. 13 is constituted by a capacitor C11a provided below the coupling wiring L1 and a capacitor C11b provided above the coupling wiring L1.

The capacitor C11a is provided below the wiring L12 of the coupling wiring L1, and constituted by the MIM metal layer ALM1, the metal layer AL1, and the insulation layer provided between these metal layers. The MIM metal layer ALM1 becomes one electrode of the capacitor C11a, and the metal layer AL1 becomes the other electrode of the capacitor C11a. The metal layer AL1 is a metal layer below the metal layer AL2 constituting the coupling wiring L1. The MIM metal layer ALM1 is a metal layer formed between the metal layer AL2 and the metal layer AL1. The MIM metal layer ALM1 is electrically coupled to the coupling wiring L1 via the via-plugs V11a and V12a.

In a capacitor C11b, the wiring L12 at the position of the capacitor C11b in the coupling wirings L1 becomes one electrode of the capacitor C11b. That is, the wiring L12 of the coupling wiring L1 is also used as one electrode of the capacitor C11b. Further, an MIM metal layer ALM2 becomes the other electrode of the capacitor C11b. The capacitor C11b is configured by providing the insulation layer between the one electrode and the other electrode. The MIM metal layer ALM2 is electrically coupled to the metal layer above AL3 the metal layer AL2 via the via-plugs V11b and V12b. In this way, the MIM metal layer ALM2 is a metal layer formed between the metal layer AL3 and the metal layer AL2.

The metal layer AL1 which becomes the other electrode of the capacitor C11a and the metal layer AL3 coupled to the MIM metal layer ALM2 which becomes the other electrode of the capacitor C11b are electrically coupled with each other via the via-plug Vab. Thereby, the capacitor Cab having the MIM stack structure becomes a capacitor in which the capacitor C11a provided below the coupling wiring L1 and the capacitor C11b provided above the coupling wiring L1 are coupled in parallel. That is, the capacitor Cab having the MIM stack structure is a capacitor having a structure in which the capacitor C11 having the structure in FIG. 9 and the capacitor C11 having the structure in FIG. 10 are stacked. That is, the capacitor C11b and the capacitor C11a are stacked in the direction DR3 orthogonal to the substrate. In this way, it is possible to realize the capacitor Cab having twice the capacity of the capacitor C11 in FIGS. 9 and 10 with a small disposition area.

Figure 14:
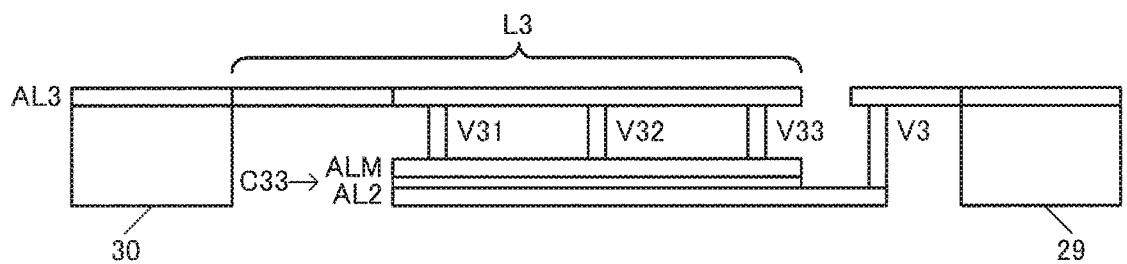
FIG. 14 is a diagram showing an example of a cross-sectional structure of the MIM capacitor.

FIG. 14 shows an example of the capacitor C33 formed in the path of the coupling wiring L3 that electrically couples the oscillation circuit 30 and the output circuit 29 with each other. In FIG. 14, the capacitor C33 having the MIM structure is constituted by an MIM metal layer ALM, a metal layer AL2, and an insulation layer provided between these metal layers. The MIM metal layer ALM becomes one electrode of the capacitor C33, and the metal layer AL2 becomes the other electrode of the capacitor C33. The capacitor C33 having the MIM structure is configured by providing the insulation layer between the one electrode and the other electrode. Note that the capacitor C33 may be provided above the coupling wiring L3 as shown in FIG. 10, or may be a capacitor having the MIM stack structure as shown in FIG. 13.

Further, the coupling wiring L3 is constituted by the metal layer AL3. The metal layer AL3 and the MIM metal layer ALM are electrically coupled with each other via the via-plugs V31, V32, and V33. The metal layer AL2 which becomes the other electrode of the capacitor C33 is electrically coupled to the input node of the output circuit 29 via, for example, the via-plug V3.

As described above, in the present embodiment, the capacitors having the MIM structure are provided so as to overlap the coupling wiring in the plan view in the direction orthogonal to the substrate. The coupling wiring is the coupling wirings L1, L2, L3, and the like, and the capacitors having the MIM structure are capacitors C11 to C13, C21 to C23, C31 to C33, and the like. In this way, the capacitors having the MIM structure can be disposed by effectively utilizing the wiring area of the coupling wiring. Thereby, even when a large number of capacitors having the MIM structure are required as shown in FIGS. 3 and 4, these capacitors having the MIM structure can be efficiently disposed using the wiring area of the coupling wiring.

Further, it is desirable that the coupling wirings L1 and L2 that couple the terminals T1 and T2, to which the vibrator 10 is coupled, and the drive circuit 32 of the oscillation circuit 30 with each other, or the coupling wiring L3 that couples the oscillation circuit 30 and the output circuit 29 with each other, have wiring widths as wide as possible in order to prevent signal attenuation due to a wiring resistance.

However, when the wiring width of the coupling wiring is wider in this way, the wiring area of the coupling wiring becomes a dead space, and the circuit area increases, thereby, the circuit device 20 is increased in scale. In this respect, according to the present embodiment, the capacitors having the MIM structure are disposed by effectively utilizing the wiring area of the coupling wirings L1, L2, and L3. Accordingly, both the coupling wirings L1, L2, and L3 and the capacitors having the MIM structure are disposed in the wiring area, and the wiring area of the coupling wirings L1, L2, and L3 does not become a dead space, thereby, an increase in circuit area can be prevented and the circuit device 20 can be reduced in size.

Further, when the wiring widths of the coupling wirings L1 and L2 are wider, the parasitic capacitance increases, and a problem such as a deterioration of the negative resistance and an attenuation of the oscillation amplitude occurs. When the load capacitance increases, the load capacitance of the oscillation circuit 30 increases, thereby, for example, there arises a problem that the frequency variable sensitivity of the variable capacitance circuit 36 described in FIG. 4 is lowered.

Figure 15:
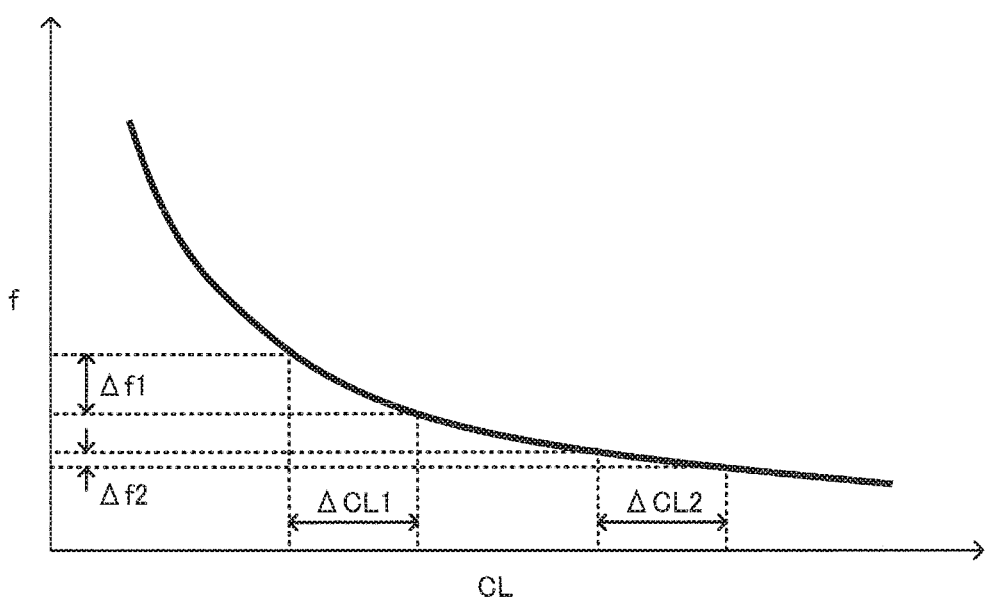
FIG. 15 is an explanatory diagram of a change in frequency variable sensitivity according to the magnitude of a load capacitance.

For example, FIG. 15 shows an example of the voltage capacitance characteristics for explaining the frequency variable sensitivity of the variable capacitance circuit 36. As shown in FIG. 15, when a load capacitance CL of the oscillation circuit 30 is small, the change in the frequency f when the load capacitance CL is changed by $\Delta$CL1 becomes $\Delta$f1, and the frequency variable sensitivity representing the frequency change with respect to the change in the load capacitance CL can be increased. However, when the load capacitance CL is large, the change in the frequency f when the load capacitance CL is changed by $\Delta$CL2=$\Delta$CL1 becomes $\Delta$f2<$\Delta$f1, and the frequency variable sensitivity becomes small as compared with the case where the load capacitance CL is small. In order to suppress such a decrease in frequency variable sensitivity, it is necessary to increase the sizes of the transistors TR1 to TRn in FIG. 4 so that the variable capacitance circuit 36 can change the load capacitance CL largely. Therefore, the circuit area of the variable capacitance circuit 36 increases, and the circuit device 20 is prevented from being downsized.

In this respect, in the present embodiment, it is possible to prevent unnecessary parasitic capacitance from being generated by disposing a capacitor having the MIM structure in the wiring area of the coupling wiring. For example, in FIG. 9, the capacitor C11 having the MIM structure is disposed below the wiring L12 of the coupling wiring L1. At this time, for example, when the capacitor C11 is not disposed, a parasitic capacitance is generated between the wiring L12 and the substrate or the like. In contrast to this, in the present embodiment, since the capacitor C11 is disposed below the wiring L12, it is possible to prevent the generation of the parasitic capacitance between the wiring L12 and the substrate or the like. The same applies to FIGS. 11 to 14. Therefore, according to the present embodiment, it is possible to prevent unnecessary parasitic capacitance from being added to the load capacitance of the oscillation circuit 30. Therefore, the increase in load capacitance can effectively suppress the deterioration of negative resistance, the attenuation of oscillation amplitude, and the decrease in frequency variable sensitivity. Further, in the case of the capacitor Cab having the MIM stack structure as shown in FIG. 13, there is an advantage that the generation of the parasitic capacitance can be suppressed by the capacitor C11a disposed below the wiring L12, and the capacity of the capacitor Cab can be increased by disposing the capacitor C11b above the wiring L12.

In the present embodiment, as described with reference to FIGS. 9 to 14, the coupling wiring is constituted by the metal layer above or the metal layer below the MIM metal layer constituting the capacitor having the MIM structure. For example, in FIG. 9, the coupling wiring L1 is constituted by the metal layer above AL3 the MIM metal layer ALM constituting the capacitor C11 having the MIM structure. In FIG. 10, the coupling wiring L1 is constituted by the metal layer below AL2 the MIM metal layer ALM constituting the capacitor C11 having the MIM structure. In this way, the coupling wiring L1 is wired above or below the capacitor C11 having the MIM structure, and one electrode of the capacitor C11 can be electrically coupled to the coupling wiring L1.

For example, in FIG. 9, the coupling wiring L1 is constituted by the metal layer above AL3 the MIM metal layer ALM. The coupling wiring L1 and the MIM metal layer ALM which becomes one electrode of the capacitor C11 are electrically coupled with each other. For example, the coupling wiring L1 and the MIM metal layer ALM are electrically coupled with each other via the via-plugs V11, V12, and V13. In this way, one electrode of the capacitor C11 can be electrically coupled to the coupling wiring L1 constituted by the metal layer above AL3 the MIM metal layer ALM constituting the one electrode. Further, by disposing the capacitor C11 having the MIM structure below the coupling wiring L1, it is possible to prevent unnecessary parasitic capacitance from being added to the coupling wiring L1.

In FIG. 10, the coupling wiring L1 is constituted by the metal layer below AL2 the MIM metal layer ALM. In the coupling wiring L1, the wiring L12 at the position of the capacitor C11 becomes one electrode of the capacitor C11. In this way, in the coupling wiring, the wiring L12 at the position of the capacitor C11 is also used as the one electrode of the capacitor C11 so that the one electrode of the capacitor C11 can be electrically coupled to the coupling wiring L1.

In the present embodiment, as described with reference to FIGS. 6, 9, 10, and the like, the coupling wiring L1 includes the wiring L11, the wiring L12 that is coupled to the wiring L11 and has a wiring width that is wider than that of the wiring L11, and the wiring L13 that is coupled to the wiring L12 and has a narrower wiring width than that of the wiring L12. The wiring L11 is a first wiring, the wiring L12 is a second wiring, and the wiring L13 is third wiring. The capacitor C11 is disposed so that the wiring L12 and the capacitor C11 overlap each other in the plan view in the direction orthogonal to the substrate. For example, in the wirings L11, L12, and L13 constituting the coupling wiring L1, the capacitor C11 is disposed below the wiring L12 having a wider wiring width. In this way, it is possible to prevent the parasitic capacitance between the wiring L12 and the substrate or the like from being added to the load capacitance of the coupling wiring L1. The wirings L11 and L13 have a narrow wiring width. Therefore, even when the capacitor having the MIM structure is not disposed below the wirings L11 and L13, since the parasitic capacitance between the wirings L11 and L13 having a narrow wiring width and the substrate is small, the load capacitance of the coupling wiring L1 does not increase so much. Therefore, by partially widening or narrowing the wiring width of the coupling wiring L1, an efficient layout disposition of the coupling wiring L1 or the capacitor C11 having the MIM structure can be achieved, a generation of the parasitic capacitance can be suppressed, and an adverse effect due to the parasitic capacitance added to the load capacitance of the coupling wiring L1 can be reduced.

In the present embodiment, as shown in FIGS. 6 and 12, the capacitor C11 having the MIM structure of which one electrode is electrically coupled to the coupling wiring L1 and the capacitor C12 having the MIM structure of which one electrode is electrically coupled to the coupling wiring L1 are provided. In this case, the capacitor C11 becomes the first capacitor, and the capacitor C12 becomes the second capacitor. For example, the capacitor C12 in FIG. 6 may be the first capacitor, and the capacitor C13 may be the second capacitor.

The coupling wiring L1 includes wiring L14 that is coupled to the wiring L13 and has a wiring width that is wider than that of the wiring L13. The wiring L13 is a third wiring, and the wiring L14 is a fourth wiring. As shown in FIGS. 6 and 12, the capacitor C12 is disposed so that the wiring L14 and the capacitor C12 overlap each other in the plan view orthogonal to the substrate. For example, as shown in FIG. 12, the capacitor C11 is disposed below the wiring L12 having a wide wiring width, and the capacitor C12 is disposed below the wiring L14 having a wide wiring width. In this way, a plurality of capacitors C11 and C12 having the MIM structure can be efficiently disposed in the wiring path of the coupling wiring L1. In the coupling wiring L1, the capacitors C11 and C12 are disposed below the wirings L12 and L14 corresponding to the positions of the capacitors C11 and C12. Therefore, even when the wiring widths of the wirings L12 and L14 are wide, the generation of the parasitic capacitance between the wirings L12 and L14, and the substrate can be suppressed, and the adverse effect caused by the parasitic capacitance added to the load capacitance of the coupling wiring L1 can be reduced.

4. Oscillation Circuit

Figure 16:
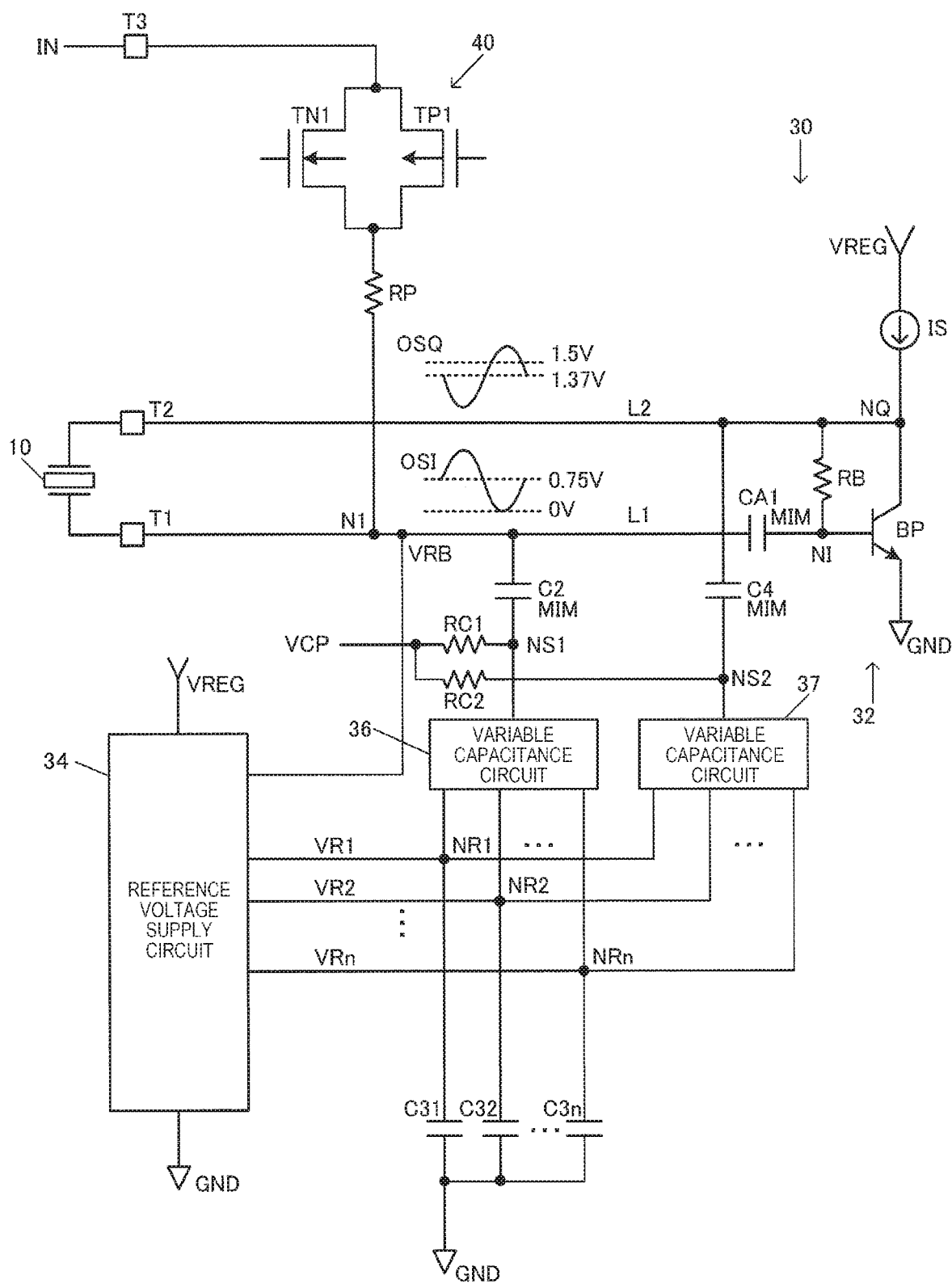
FIG. 16 shows a detailed first configuration example of the oscillation circuit.

FIG. 16 shows a detailed first configuration example of the oscillation circuit 30. The oscillation circuit 30 in FIG. 16 includes a drive circuit 32, a DC cut capacitor CA1, a reference voltage supply circuit 34, a DC cut capacitor C2, and a variable capacitance circuit 36. The oscillation circuit 30 can include a DC cut capacitor C4 and a variable capacitance circuit 37. The configuration of the variable capacitance circuit 37 is a circuit having the same configuration as that of the variable capacitance circuit 36, and a detailed description thereof will be omitted. Note that the capacitor C4 and the variable capacitance circuit 37 are not indispensable components. A modification can be possible without providing the capacitor C4 and the variable capacitance circuit 37. Capacitors C31 to C3$n$ are provided between the variable capacitance circuit 36 and the variable capacitance circuit 37, and the GND node.

Figure 17:
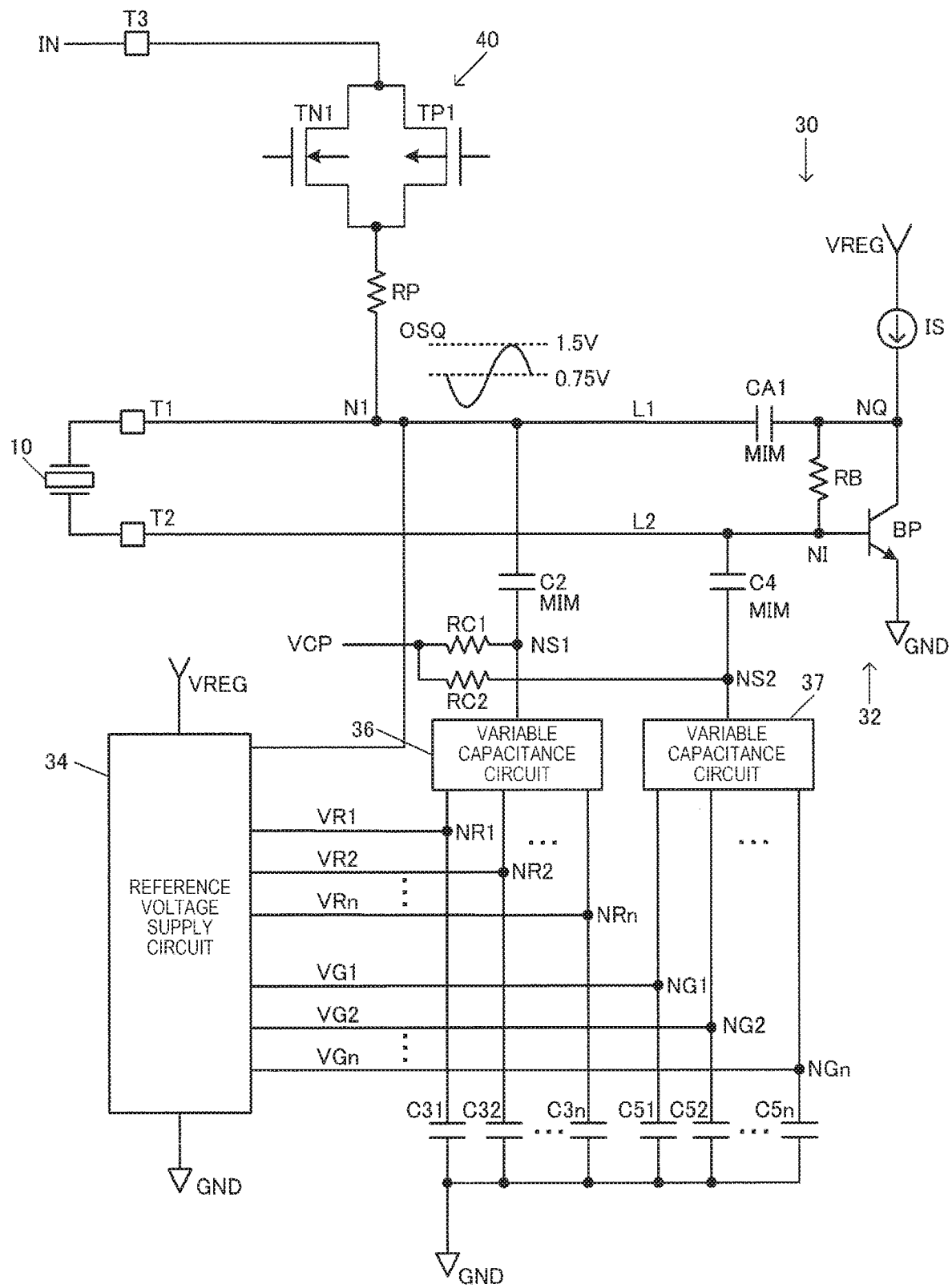
FIG. 17 shows a detailed second configuration example of the oscillation circuit.

The drive circuit 32 is a circuit that drives the vibrator 10 to oscillate. In FIG. 16, the drive circuit 32 includes a current source IS, a bipolar transistor BP, and a resistor RB. The DC cut capacitor CA1 is provided between an input node NI of the drive circuit 32 and the coupling wiring L1. For example, the capacitor CA1 has one end coupled to the input node NI of the drive circuit 32 and the other end coupled to the coupling wiring L1. The coupling wiring L1 is a first coupling wiring coupled to the terminal T1. By providing such a capacitor CA1, the DC component of the oscillation signal OSI is cut, and only the AC component is transmitted to the input node NI of the drive circuit 32, so that the bipolar transistor BP can be properly operated. Note that, as shown in FIG. 17 to be described later, the DC cut capacitor CA1 may be provided between an output node NQ of the drive circuit 32 and the coupling wiring L1.

The reference voltage supply circuit 34 supplies the reference voltages VR1 to VRn to the variable capacitance circuit 36 and the variable capacitance circuit 37. The reference voltage supply circuit 34 includes a plurality of resistors provided in series between the VREG node and the GND node, and outputs voltages obtained by dividing the VREG voltage as reference voltages VR1 to VRn. In this case, resistors are provided between a coupling node between the resistors of the plurality of resistors, and output nodes of the reference voltages VR1 to VRn. Thereby, the reference voltages VR1 to VRn can be supplied with resistance separation.

The reference voltage supply circuit 34 supplies a reference voltage VRB for setting a bias voltage to the coupling wiring L1. The reference voltage supply circuit 34 supplies the reference voltage of, for example, VRB=0.75 V to the coupling wiring L1, so that an amplitude center voltage of the oscillation signal OSI in the coupling wiring L1 can be set to 0.75 V. The amplitude center voltage 1.37 V of the oscillation signal OSQ in the coupling wiring L2 is set based on, for example, a base-emitter voltage VBE of the bipolar transistor BP and a base current IB flowing through the resistor RB. For example, the amplitude center voltage of the oscillation signal OSQ is set to a voltage of VBE+IB× RB.

A DC cut capacitor C2 has one end electrically coupled to the coupling wiring L1 and the other end electrically coupled to the supply node NS1 of the capacitance control voltage VCP. The capacitance control voltage VCP is supplied to the supply node NS1 via the resistor RC1. The capacitance control voltage VCP is variably controlled in a voltage range of 0.2 V to 1.3 V, for example. One end of the variable capacitance circuit 36 is electrically coupled to the supply node NS1, and the capacitance control voltage VCP is supplied. The reference voltage supply circuit 34 supplies the reference voltages VR1 to VRn to the supply nodes NR1 to NRn at the other end of the variable capacitance circuit 36. The capacitors C31 to C3n are provided between supply nodes NR1 to NRn of the reference voltages VR1 to VRn and the GND node.

A DC cut capacitor C4 has one end electrically coupled to the coupling wiring L2 and the other end electrically coupled to the supply node NS2 of the capacitance control voltage VCP. The capacitance control voltage VCP is supplied to the supply node NS2 via the resistor RC2. One end of the variable capacitance circuit 37 is electrically coupled to the supply node NS2, and the capacitance control voltage VCP is supplied. The reference voltage supply circuit 34 supplies the reference voltages VR1 to VRn to the supply nodes NR1 to NRn at the other end of the variable capacitance circuit 37.

In FIG. 16, the switch circuit 40 is provided between the terminal T3 and the coupling wiring L1. A resistor RP is provided between the switch circuit 40 and the node N1 of the coupling wiring L1. The switch circuit 40 can be realized by, for example, a transfer gate or the like constituted by a P-type transistor TP1 and an N-type transistor TN1. In the test mode, the switch circuit 40 is turned on, and a test external input signal IN input via the terminal T3 is input to one end of the vibrator 10 via the switch circuit 40, the coupling wiring L1, and the terminal T1. Thereby, it is possible to perform tests and inspections such as overdrive or DLD.

When the switch circuit 40 is provided for the test mode, a leakage current is generated in the N-type transistor TN1 of the switch circuit 40, and this leakage current may cause a problem that the oscillation frequency becomes unstable. For example, when an oscillation amplitude of the oscillation signal OSI in the coupling wiring L1 swings greatly to the negative voltage side, the N-type transistor TN1 of the switch circuit 40 becomes a weakly turned-on state, and the leakage current flows to the terminal T3 side.

On the other hand, the external input signal IN such as a frequency control signal, an output enable signal, or a standby signal is input to the terminal T3 in the normal operation mode, and the voltage level of the external input signal IN changes variously. Therefore, when the voltage level of the external input signal IN changes, the magnitude of the leakage current flowing through the N-type transistor TN1 also changes, and the oscillation frequency of the oscillation circuit 30 becomes unstable.

In this regard, in the configuration example in FIG. 16, a DC cut capacitor CA1 is provided between the coupling wiring L1 coupled to the terminal T1 of the vibrator 10 and the input node NI of the drive circuit 32 of the oscillation circuit 30. By providing such a DC cut capacitor CA1, the reference voltage VRB having any voltage level can be supplied to the coupling wiring L1. Note that the DC voltage level of the input node NI is set to the base-emitter voltage VBE of the bipolar transistor BP.

The reference voltage supply circuit 34 supplies the reference voltage VRB that prevents the voltage level of the oscillation signal OSI from greatly swinging to the negative voltage side to the coupling wiring L1. For example, a reference voltage VRB having a voltage level that does not cause a leakage current due to a forward bias of the PN junction of the transistor TN1 is supplied to the coupling wiring L1. In FIG. 16 the reference voltage supply circuit 34 supplies the reference voltage VRB=0.75 V to the coupling wiring L1. Thereby, the voltage level of the oscillation signal OSI does not greatly swing to the negative voltage side, and in the N-type transistor TN1 of the switch circuit 40, a leakage current caused by a negative voltage is prevented from occurring. A DC cut capacitor C2 is provided between the coupling wiring L1 and the supply node NS1 of the capacitance control voltage VCP so that the reference voltage VRB supplied to the coupling wiring L1 does not affect the capacity of the variable capacitance circuit 36. In this way, even when the voltage level of the reference voltage VRB which is supplied to the coupling wiring L1 is set to a relatively high voltage level such as 0.75 V, it is possible to prevent the capacity of the variable capacitance circuit 36 from being affected. The same applies to the variable capacitance circuit 37. For the amplitude center voltage of the oscillation signal OSQ in the coupling wiring L2 is set based on, for example, a base-emitter voltage VBE of the bipolar transistor BP and a base current IB flowing through the resistor RB. For example, the amplitude center voltage of the oscillation signal OSQ is set to a voltage level of VBE+IB×RB, and is set to 1.37 V, for example, in FIG. 16.

FIG. 17 shows a detailed second configuration example of the oscillation circuit 30. In FIG. 16, the DC cut capacitor CA1 is provided between the input node NI of the drive circuit 32 of the oscillation circuit 30 and the coupling wiring L1, but in FIG. 17, the DC cut capacitor CA1 is provided between the output node NQ of the drive circuit 32 and the coupling wiring L1. In other words, in FIG. 16, the terminal T1 is a terminal on the input node NI side of the drive circuit 32, but in FIG. 17, the terminal T1 is a terminal on the output node NQ side of the drive circuit 32. Further, one end of the switch circuit 40 is coupled to the coupling wiring L1, and the reference voltage supply circuit 34 supplies the reference voltage VRB=0.75 V to the coupling wiring L1. For example, the substrate of the P-type transistor TP1 of the switch circuit 40 is set to the regulated voltage VREG=1.5 V in the normal operation mode. As described above, when the substrate of the transistor TP1 is set to the regulated voltage VREG=1.5 V, if the amplitude voltage of the oscillation signal OSQ greatly exceeds 1.5 V, a leakage current may occur in the transistor TP1. In this regard, in FIG. 17, when the reference voltage supply circuit 34 supplies the reference voltage VRB=0.75 V to the coupling wiring L1, the amplitude center voltage of the oscillation signal OSQ is set to 0.75 V, and the operation is performed so that the amplitude voltage of the oscillation signal OSQ does not greatly exceed 1.5 V. Thereby, the leakage current is prevented from occurring in the transistor TP1, and a situation in which the oscillation frequency fluctuates due to the leakage current can be prevented.

In FIG. 16, the reference voltage supply circuit 34 supplies the common reference voltages VR1 to VRn to the variable capacitance circuit 36 and the variable capacitance circuit 37, but in FIG. 17, the reference voltage supply circuit 34 supplies the reference voltages VR1 to VRn to the variable capacitance circuit 36 and supplies the reference voltages VG1 to VGn to the variable capacitance circuit 37. The reference voltages VR1 to VRn and the reference voltages VG1 to VGn are, for example, reference voltages having the same voltage level. Note that both the voltage levels may be different.

The reference voltage supply circuit 34 includes a plurality of resistors provided in series between the VREG node and the GND node, and outputs voltages obtained by dividing the VREG voltage as reference voltages VR1 to VRn and VG1 to VGn. In this case, resistors are provided between coupling nodes between the resistors of the plurality of resistors, and output nodes of the reference voltages VR1 to VRn. Further, resistors are also provided between coupling nodes between the resistors of the plurality of resistors, and output nodes of the reference voltages VG1 to VGn. Thereby, the reference voltages VR1 to VRn and the reference voltages VG1 to VGn can be supplied with resistance separation.

One end of the variable capacitance circuit 37 is electrically coupled to the supply node NS2, and the capacitance control voltage VCP is supplied. The reference voltage supply circuit 34 supplies the reference voltages VG1 to VGn to the supply nodes NG1 to NGn at the other end of the variable capacitance circuit 37. The capacitors C51 to C5n are provided between supply nodes NG1 to NGn of the reference voltages VG1 to VGn and the GND node.

In the present embodiment, capacitors having the MIM structure are used as the capacitors CA1, C2, C4, and the like in FIGS. 16 and 17.

5. Oscillator

Figure 18:
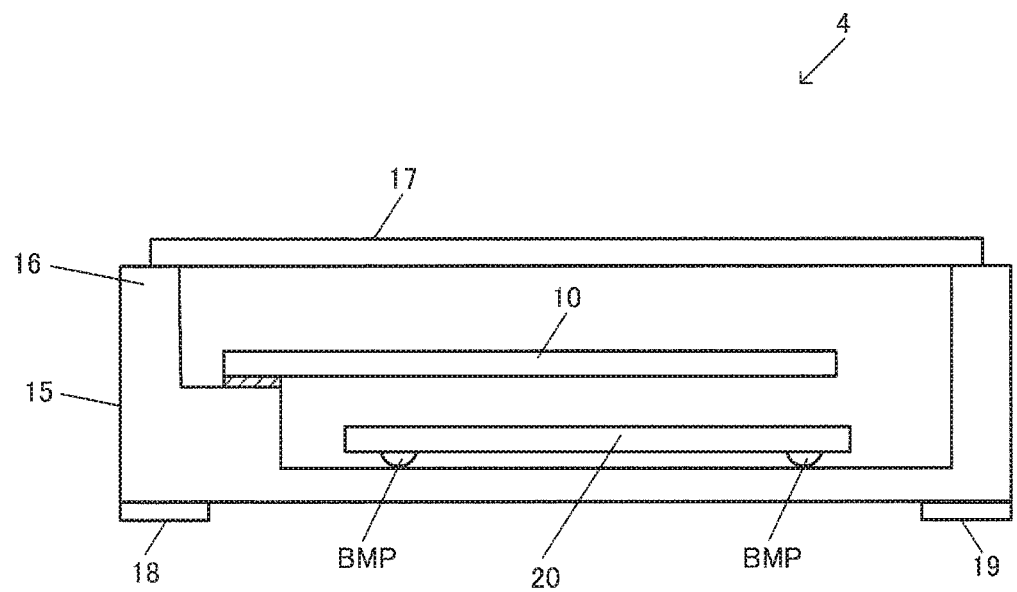
FIG. 18 shows a first structural example of the oscillator.

Next, a structural example of the oscillator 4 of the present embodiment will be described. FIG. 18 shows a first structural example of the oscillator 4. The oscillator 4 has the vibrator 10, the circuit device 20, and the package 15 that accommodates the vibrator 10 and the circuit device 20. The package 15 is made of, for example, ceramic or the like, and has an accommodation space inside thereof, and the vibrator 10 and the circuit device 20 are accommodated in the accommodation space. The accommodation space is hermetically sealed and is preferably in a reduced pressure state that is close to a vacuum state. With the package 15, the vibrator 10 and the circuit device 20 can be suitably protected from impact, dust, heat, moisture, and the like.

The package 15 has a base 16 and a lid 17. Specifically, the package 15 includes a base 16 that supports the vibrator 10 and the circuit device 20, and a lid 17 that is bonded to the upper surface of the base 16 so as to form an accommodation space with the base 16. And the vibrator 10 is supported by the step portion provided inside the base 16 via the terminal electrode. The circuit device 20 is disposed on the inner bottom surface of the base 16. Specifically, the circuit device 20 is disposed such that the active surface faces the inner bottom surface of the base 16. The active surface is a surface on which circuit elements of the circuit device 20 are formed. Further, bumps BMP are formed on terminals that are pads of the circuit device 20. The circuit device 20 is supported on the inner bottom surface of the base 16 via the conductive bumps BMP. The conductive bump BMP is, for example, a metal bump, and the vibrator 10 and the circuit device 20 are electrically coupled to each other via the bump BMP, the internal wiring of the package 15, the terminal electrode, or the like. The circuit device 20 is electrically coupled to the external terminals 18 and 19 of the oscillator 4 via the bumps BMP or the internal wiring of the package 15. The external terminals 18 and 19 are formed on the outer bottom surface of the package 15. The external terminals 18 and 19 are coupled to an external device via the external wirings. The external wiring is, for example, a wiring or the like formed on a circuit substrate on which an external device is mounted. Thereby, a clock signal or the like can be output to the external device.

In FIG. 18, the circuit device 20 is flip-mounted so that the active surface of the circuit device 20 faces downward, but the present embodiment is not limited to such mounting. For example, the circuit device 20 may be mounted so that the active surface of the circuit device 20 faces upward. That is, the circuit device 20 is mounted so that the active surface faces the vibrator 10.

Figure 19:
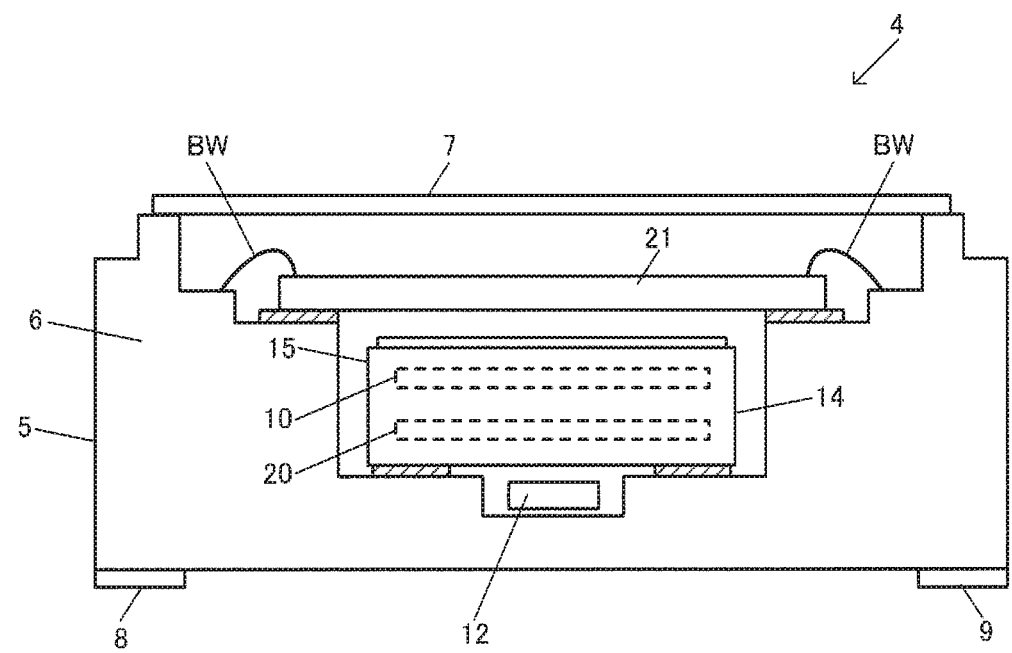
FIG. 19 shows a second structural example of the oscillator.

FIG. 19 shows a second structural example of the oscillator 4. The oscillator 4 in FIG. 19 includes a vibrator 10, a circuit device 20, and a circuit device 21. The oscillator 4 also includes the package 15 accommodating the vibrator 10 and the circuit device 20, and a package 5 accommodating the package 15 and the circuit device 21. The package 15 and the package 5 are a first package and a second package, respectively. The first package and the second package can also be referred to as a first container and a second container.

In the present embodiment, the circuit device 20 accommodated in the package 15 performs the first temperature compensation processing, and the circuit device 21 accommodated in the package 5 performs the second temperature compensation processing. For example, the vibrator 10 and the circuit device 20 are accommodated in the package 15, so that a temperature compensation type oscillator 14 that performs, for example, an analog-mode first temperature compensation processing is configured. Further, the oscillator 14 that performs analog-mode first temperature compensation processing and the circuit device 21 that performs digital-mode second temperature compensation processing are accommodated in the package 5, so that the oscillator 4 that generates highly accurate clock signal is configured. The circuit device 21 can also be called a correction IC that performs the second temperature compensation processing with a fine adjustment in a digital-mode.

Specifically, the package 5 is made of, for example, ceramic or the like, and has an accommodation space inside thereof. In this accommodation space, the oscillator 14, in which the vibrator 10 and the circuit device 20 are accommodated in the package 15, and the circuit device 21 are accommodated. The accommodation space is hermetically sealed and is preferably in a reduced pressure state that is close to a vacuum state. With the package 5, the circuit device 21 and the oscillator 14 can be suitably protected from impact, dust, heat, moisture, and the like.

The package 5 has a base 6 and a lid 7. Specifically, the package 5 includes a base 6 that supports the oscillator 14 and the circuit device 21, and a lid 7 that is bonded to the upper surface of the base 6 so as to form an accommodation space with the base 6. The base 6 has a first recess portion opening on the upper surface and a second recess portion opening on the bottom surface of the first recess portion. The circuit device 21 is supported on the bottom surface of the first recess portion. For example, the circuit device 21 is supported by a step portion on the bottom surface via a terminal electrode. The oscillator 14 is supported on the bottom surface of the second recess portion. For example, the oscillator 14 is supported by the step portion on the bottom surface via the terminal electrode. Further, the base 6 has a third recess portion opening in the bottom surface of the second recess portion, and the circuit component 12 is disposed in the third recess portion. For example, a capacitor or a temperature sensor can be assumed as the circuit component 12 to be disposed.

The circuit device 21 is electrically coupled to a terminal of the oscillator 14 via, for example, a bonding wire BW, a terminal electrode formed in a step portion, or an internal wiring of the package 5. Thereby, the clock signal or the temperature detection signal from the oscillator 14 can be input to the circuit device 21. Further, the circuit device 21 is electrically coupled to an external terminals 8 and 9 of the oscillator 4 via the bonding wire BW, the terminal electrode formed in the step portion, and the internal wiring of the package 5. The external terminals 8 and 9 are formed on the outer bottom surface of the package 5. The external terminals 8 and 9 are coupled to an external device via the external wirings. The external wiring is, for example, a wiring or the like formed on a circuit substrate on which an external device is mounted. Thereby, a clock signal or the like can be output to the external device. Note that the terminal of the oscillator 14 and the external terminals 8 and 9 may be electrically coupled with each other.

In FIG. 19, the circuit device 21 is disposed in the upward direction of the oscillator 14, but the circuit device 21 may be disposed in the downward direction of the oscillator 14. The upward direction is a direction from the bottom surface of the package 5 toward the lid 7, and the downward direction is the opposite direction. The circuit device 21 may be provided on the side of the oscillator 14. That is, the oscillator 14 and the circuit device 21 are arranged side by side so as to be aligned in an upper surface view of the oscillator 4.

Next, the circuit device 21 will be described. The circuit device 21 includes a clock signal generation circuit to which a first clock signal that is a clock signal generated by the oscillator 14 is input as a reference clock signal. The clock signal generated by the clock signal generation circuit is output to the outside as an output clock signal of the oscillator 4. For example, the clock signal generation circuit of the circuit device 21 is constituted by a fractional N-type PLL circuit to which the first clock signal from the oscillator 14 is input as a reference clock signal. The PLL circuit performs a phase comparison of a reference clock signal that is a first clock signal and a feedback clock signal obtained by dividing the output clock signal of the PLL circuit by a frequency dividing circuit. A fractional N-type PLL circuit is realized by setting a fractional division ratio using a delta sigma modulation circuit. Further, the control circuit included in the circuit device 21 performs correction processing of the division ratio data set in the PLL circuit based on the temperature compensation data, thereby the second temperature compensation processing is realized. The first temperature compensation processing performed in the oscillator 14 is realized by, for example, polynomial approximation temperature compensation processing performed by the control circuit 50 in FIGS. 1 and 2. The clock signal generation circuit may be constituted by a direct digital synthesizer. In this case, the second temperature compensation processing is realized by inputting the frequency control data corrected by the temperature compensation data with respect to the direct digital synthesizer that operates using the first clock signal as a reference clock signal.

According to the oscillator 4 in FIG. 19, the circuit device 20 that oscillates the vibrator 10 performs the first temperature compensation processing, thereby the amount of the frequency fluctuation in the frequency temperature characteristics of the first clock signal which is output from the circuit device 20 that is a first circuit device, can be reduced. Further, the circuit device 21 that is the second circuit device performs the second temperature compensation processing when the clock signal is generated based on the first clock signal from the circuit device 20. As described above, the second temperature compensation processing is performed by the circuit device 21 after the first temperature compensation processing is performed by the circuit device 20, thereby it becomes possible to reduce or the like the micro-jump of frequency caused by variation of the temperature measurement result or the like, and possible to realize the clock frequency of the oscillator 4 with high accuracy or the like. In the oscillator 4 in FIG. 19, the first temperature compensation processing may be performed using a temperature sensor provided in the circuit device 20, and a temperature detection signal of this temperature sensor may be output from the circuit device 20 and input to the circuit device 21. The circuit device 21 may perform the second temperature compensation processing based on the input temperature detection signal. As described above, the first temperature compensation processing in the circuit device 20 and the second temperature compensation processing in the circuit device 21 can be performed based on the temperature detection signal from the same temperature sensor so that more appropriate temperature compensation processing can be realized. In this case, a distance between the temperature sensor built in the circuit device 20 and the vibrator 10 is shorter than a distance between the temperature sensor and the circuit device 21. Accordingly, by performing the digital temperature compensation processing, the distance between the circuit device 21 that generates a large amount of heat and the vibrator 10 can be increased, and the adverse effect of the heat generated by the circuit device 21 on the temperature detection result of the temperature sensor can be reduced. Therefore, the temperature of the vibrator 10 can be measured more accurately using the temperature sensor built in the circuit device 20.

6. Electronic Apparatus and Vehicle

Figure 20:
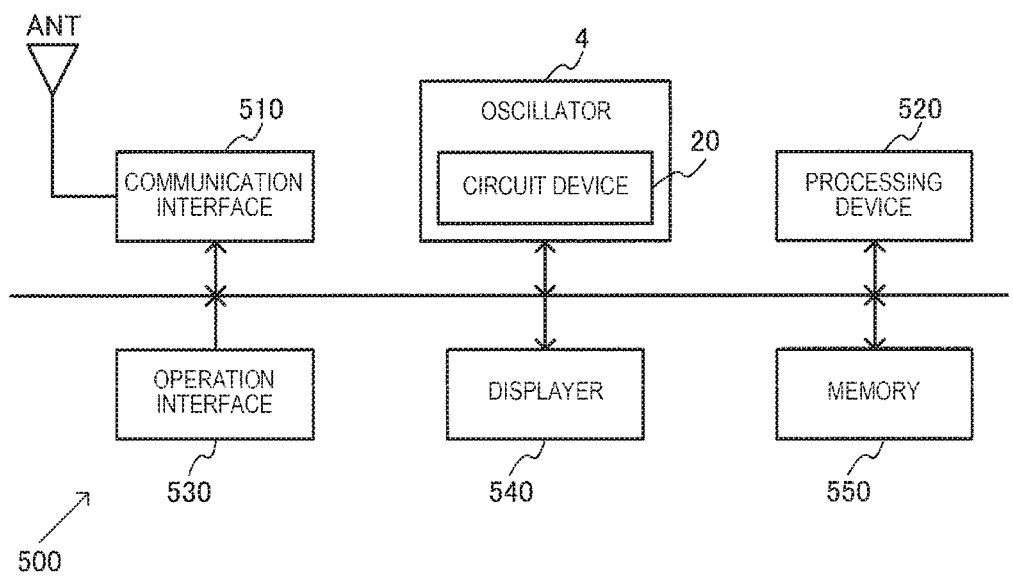
FIG. 20 shows a configuration example of an electronic apparatus.

FIG. 20 shows a configuration example of an electronic apparatus 500 including the circuit device 20 of the present embodiment. The electronic apparatus 500 includes the circuit device 20 of the present embodiment and a processing device 520 that operates by a clock signal based on the oscillation signal of the oscillation circuit 30 of the circuit device 20. Specifically, the electronic apparatus 500 includes the oscillator 4 having the circuit device 20 of the present embodiment, and the processing device 520 operates based on the clock signal from the oscillator 4. The electronic apparatus 500 can include an antenna ANT, a communication interface 510, an operation interface 530, a displayer 540, and a memory 550. The electronic apparatus 500 is not limited to the configuration shown in FIG. 20, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the circuit device 20 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the circuit device 20 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various types of information and can be realized by a display such as a liquid crystal or an organic EL. The memory 550 stores data, and the function can be realized by a semiconductor memory such as a RAM or a ROM.

Figure 21:
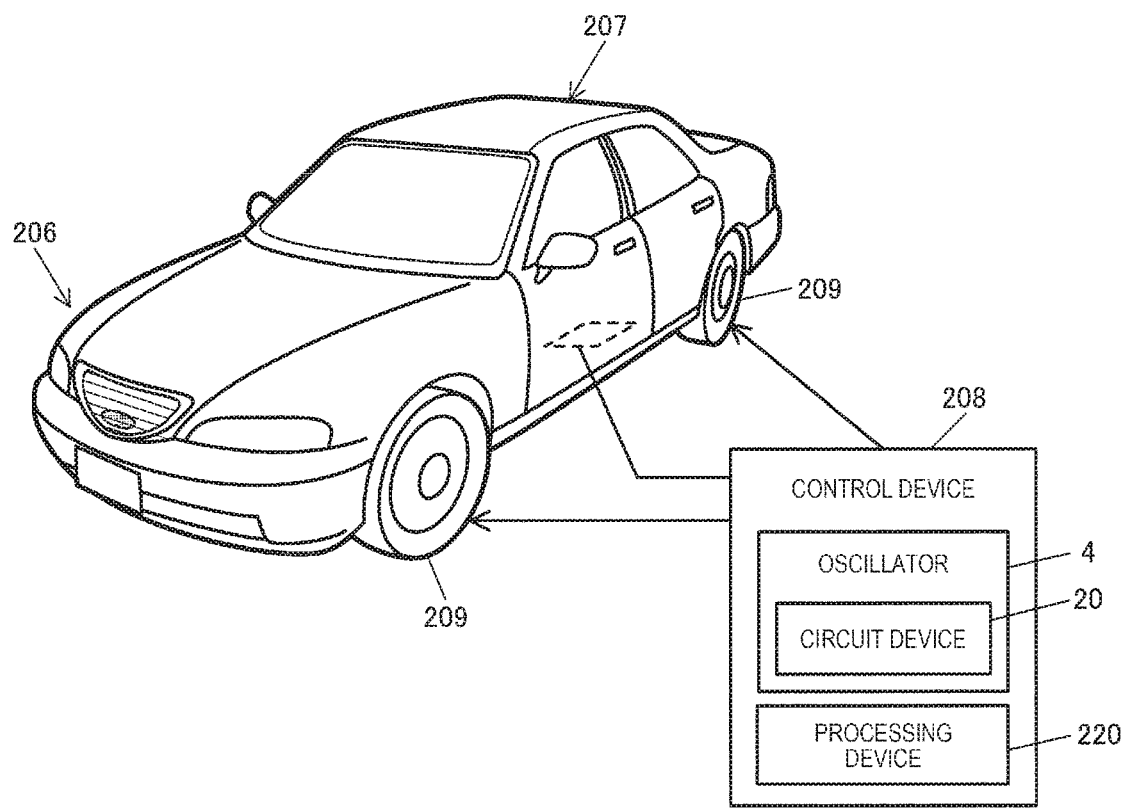
FIG. 21 shows a configuration example of a vehicle.

FIG. 21 shows an example of a vehicle including the circuit device 20 of the present embodiment. The vehicle includes the circuit device 20 of the present embodiment and a processing device 220 that operates by a clock signal based on an oscillation signal of the oscillation circuit 30 of the circuit device 20. Specifically, the vehicle includes the oscillator 4 having the circuit device 20 of the present embodiment, and the processing device 220 operates based on the clock signal from the oscillator 4. The circuit device 20 of the present embodiment can be incorporated into various moving objects such as vehicles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 21 schematically shows an automobile 206 as a specific example of the vehicle. The automobile 206 incorporates the circuit device 20 of the present embodiment. Specifically, the automobile 206 that is a vehicle includes a control device 208, and the control device 208 includes the oscillator 4 including the circuit device 20 of the present embodiment and a processing device 220 operating based on a clock signal generated by the oscillator 4. The control device 208, for example, controls the hardness of the suspension according to the posture of a vehicle body 207, and controls brakes of the individual wheels 209. For example, automatic driving of the automobile 206 may be realized by the control device 208. The apparatus in which the circuit device 20 of the present embodiment is incorporated is not limited to such a control device 208, and can be incorporated in various in-vehicle apparatuses such as a meter panel apparatus and a navigation apparatus provided in a moving object such as the automobile 206.

As described above, the circuit device according to the present embodiment includes: a first terminal electrically coupled to one end of a vibrator; a second terminal electrically coupled to the other end of the vibrator; a first coupling wiring electrically coupled to the first terminal; a second coupling wiring electrically coupled to the second terminal; and an oscillation circuit having a drive circuit for driving the vibrator via the first coupling wiring and the second coupling wiring, and oscillating the vibrator. Further, the circuit device includes a first capacitor having a metal-insulator-metal (MIM) structure of which one electrode is electrically coupled to the first coupling wiring. The first coupling wiring and the first capacitor having the MIM structure overlap each other in plan view in a direction orthogonal to a substrate on which a circuit element is formed.

According to the present embodiment, the oscillation circuit oscillates the vibrator by driving the vibrator by the drive circuit via the first coupling wiring and the second coupling wiring. The one electrode of the first capacitor having the MIM structure is electrically coupled to the first coupling wiring. The first coupling wiring and the first capacitor overlap each other in the plan view in the direction orthogonal to the substrate. As described above, when the first capacitor having the MIM structure of which the one electrode is electrically coupled to the first coupling wiring is necessary, the first capacitor having the MIM structure can be disposed by effectively utilizing the wiring area of the first coupling wiring. Further, by effectively utilizing the wiring area of the first coupling wiring and disposing the capacitor having the MIM structure, the circuit area can be reduced, and the circuit device can be reduced in scale.

In the present embodiment, the first coupling wiring may be constituted by a metal layer above or a metal layer below an MIM metal layer of the first capacitor.

As described above, the first coupling wiring can be wired above or below the first capacitor having the MIM structure, and the one electrode of the first capacitor can be electrically coupled to the first coupling wiring.

In the present embodiment, the first coupling wiring may be constituted by the metal layer above the MIM metal layer, and the first coupling wiring and the MIM metal layer that is the one electrode of the first capacitor may be electrically coupled with each other.

As described above, the one electrode of the first capacitor can be electrically coupled to the first coupling wiring constituted by the metal layer above the MIM metal layer which constitutes the one electrode.

In the present embodiment, the first coupling wiring may be constituted by the metal layer below the MIM metal layer, and in the first coupling wiring, a wiring at a position of the first capacitor may be the one electrode of the first capacitor.

As described above, in coupling wiring, the wiring at the position of the first capacitor is also used as the one electrode of the first capacitor and the one electrode of the first capacitor can be electrically coupled to the first coupling wiring.

In the present embodiment, the first coupling wiring may include a first wiring, a second wiring coupled to the first wiring and having a wiring width that is wider than a wiring width of the first wiring, and a third wiring coupled to the second wiring and having a wiring width that is narrower than the wiring width of the second wiring, and the second wiring and the first capacitor may overlap each other in the plan view.

As described above, the first capacitor can be disposed by effectively utilizing the wiring area of the second wiring having a wide wiring width in the first wiring, the second wiring, and the third wiring constituting the first coupling wiring, thereby, an efficient layout disposition of the first coupling wiring or the first capacitor having the MIM structure becomes possible.

In the present embodiment, the circuit device may include a second capacitor having the MIM structure of which one electrode is electrically coupled to the first coupling wiring, in which the first coupling wiring may include a fourth wiring coupled to the third wiring and having a wiring width that is wider than the wiring width of the third wiring, and the fourth wiring and the second capacitor may overlap each other in the plan view.

As described above, the first capacitor and the second capacitor can be disposed by effectively utilizing the wiring area of the second wiring and the fourth wiring having a wide wiring width in the first wiring, the second wiring, the third wiring, and the fourth wiring constituting the first coupling wiring, thereby, an efficient layout disposition of the first coupling wiring, or the first capacitor and the second capacitor having the MIM structure become possible.

In the present embodiment, the circuit device may include an output circuit electrically coupled to the oscillation circuit via a third coupling wiring, and buffering an oscillation signal from the oscillation circuit and outputting a clock signal, and a third capacitor having the MIM structure, in which the third coupling wiring and the third capacitor may overlap each other in the plan view.

As described above, the third capacitor having the MIM structure can be disposed by effectively utilizing the wiring area of the third coupling wiring.

In the present embodiment, the third capacitor may be a DC cut capacitor provided between the third coupling wiring and the output circuit.

As described above, the DC component of the oscillation signal can be cut and input to the output circuit using the third capacitor having the MIM structure disposed by effectively utilizing the wiring area of the third coupling wiring.

In the present embodiment, the oscillation circuit may include a variable capacitance circuit adjusting a load capacitance of the oscillation circuit, and the first capacitor may be a capacitor constituting the variable capacitance circuit.

As described above, by using the capacitor having the MIM structure as the capacitor constituting the variable capacitance circuit, it is possible to increase the adjustment range of the capacity of the variable capacitance circuit, and it is possible to appropriately adjust the load capacitance.

In the present embodiment, the oscillation circuit may include a variable capacitance circuit adjusting a load capacitance of the oscillation circuit, and the first capacitor may be a DC cut capacitor provided between the first coupling wiring and the variable capacitance circuit.

As described above, by electrically coupling the variable capacitance circuit to the first coupling wiring via the DC cut capacitor, the load capacitance of the oscillation circuit can be appropriately adjusted using the variable capacitance circuit.

In the present embodiment, the first capacitor may be a DC cut capacitor provided between the first coupling wiring and an input node or an output node of the drive circuit.

As described above, the DC cut capacitor can be disposed by effectively utilizing the wiring area of the first coupling wiring. Further, the DC component of the oscillation signal in the first coupling wiring can be cut using the DC cut capacitor and transmitted to the drive circuit.

Further, the present embodiment relates to an oscillator including the circuit device described above and the vibrator.

Further, the present embodiment relates to an electronic apparatus including the circuit device described above and a processing device that operates according to a clock signal based on an oscillation signal of the oscillation circuit.

Further, the present embodiment relates to a vehicle including the circuit device described above and a processing device that operates according to a clock signal based on an oscillation signal of the oscillation circuit.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configurations/operations of the circuit device, the oscillator, the electronic apparatus, and the vehicle are not limited to those described in this embodiment, and various modifications can be made.

What is claimed is:

1. A circuit device comprising:
    a first terminal electrically coupled to one end of a vibrator;
    a second terminal electrically coupled to the other end of the vibrator;
    a first coupling wiring electrically coupled to the first terminal;
    a second coupling wiring electrically coupled to the second terminal;
    an oscillation circuit having a drive circuit for driving the vibrator via the first coupling wiring and the second coupling wiring, and oscillating the vibrator; and
    a first capacitor having a metal-insulator-metal (MIM) structure of which one electrode is electrically coupled to the first coupling wiring, wherein
    the first coupling wiring and the first capacitor having the MIM structure overlap each other in plan view in a direction orthogonal to a substrate on which a circuit element is formed.

2. The circuit device according to claim 1, wherein the first coupling wiring is constituted by a metal layer above or a metal layer below an MIM metal layer of the first capacitor.

3. The circuit device according to claim 2, wherein
    the first coupling wiring is constituted by the metal layer above the MIM metal layer, and
    the first coupling wiring and the MIM metal layer that is the one electrode of the first capacitor are electrically coupled with each other.

4. The circuit device according to claim 2, wherein
    the first coupling wiring is constituted by the metal layer below the MIM metal layer, and
    in the first coupling wiring, a wiring at a position of the first capacitor is the one electrode of the first capacitor.

5. The circuit device according to claim 1, wherein
    the first coupling wiring includes a first wiring, a second wiring coupled to the first wiring and having a wiring width that is wider than a wiring width of the first wiring, and a third wiring coupled to the second wiring and having a wiring width that is narrower than the wiring width of the second wiring, and
    the second wiring and the first capacitor overlap each other in the plan view.

6. The circuit device according to claim 5, further comprising:
    a second capacitor having a MIM structure of which one electrode is electrically coupled to the first coupling wiring, wherein
    the first coupling wiring includes a fourth wiring coupled to the third wiring and having a wiring width that is wider than the wiring width of the third wiring, and
    the fourth wiring and the second capacitor overlap each other in the plan view.

7. The circuit device according to claim 1, further comprising:
- an output circuit electrically coupled to the oscillation circuit via a third coupling wiring, and buffering an oscillation signal from the oscillation circuit and outputting a clock signal; and
- a third capacitor having a MIM structure, wherein
- the third coupling wiring and the third capacitor overlap each other in the plan view.

8. The circuit device according to claim 7, wherein the third capacitor is a DC cut capacitor provided between the third coupling wiring and the output circuit.

9. The circuit device according to claim 1, wherein the oscillation circuit includes a variable capacitance circuit adjusting a load capacitance of the oscillation circuit, and
the first capacitor is a capacitor constituting the variable capacitance circuit.

10. The circuit device according to claim 1, wherein the oscillation circuit includes a variable capacitance circuit adjusting a load capacitance of the oscillation circuit, and
the first capacitor is a DC cut capacitor provided between the first coupling wiring and the variable capacitance circuit.

11. The circuit device according to claim 1, wherein the first capacitor is a DC cut capacitor provided between the first coupling wiring and an input node or an output node of the drive circuit.

12. An oscillator comprising:
the circuit device according to claim 1; and
the vibrator.

13. An electronic apparatus comprising:
the circuit device according to claim 1; and
a processing device operating according to a clock signal based on an oscillation signal of the oscillation circuit.

14. A vehicle comprising:
the circuit device according to claim 1; and
a processing device operating according to a clock signal based on an oscillation signal of the oscillation circuit.

* * * * *